(12) United States Patent
Kim et al.

(10) Patent No.: US 10,290,509 B2
(45) Date of Patent: May 14, 2019

(54) METHODS FOR FABRICATING SEMICONDUCTOR DEVICES USING A MULTILAYER LITHOGRAPHY PROCESS

(71) Applicant: Samsung Electronics Co., Ltd., Suwon-si, Gyeonggi-do (KR)

(72) Inventors: Nam-Gun Kim, Yongin-si (KR); Sangmin Lee, Hwaseong-si (KR); Sinhae Do, Busan (KR); Seok-Won Cho, Suwon-si (KR); Taeseop Choi, Hwaseong-si (KR); Kon Ha, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 72 days.

(21) Appl. No.: 15/443,370

(22) Filed: Feb. 27, 2017

(65) Prior Publication Data

US 2018/0033637 A1    Feb. 1, 2018

(30) Foreign Application Priority Data

Jul. 27, 2016    (KR) .................. 10-2016-0095592

(51) Int. Cl.
| | | |
|---|---|---|
| *H01L 21/311* | (2006.01) | |
| *G03F 7/20* | (2006.01) | |
| *H01L 21/033* | (2006.01) | |
| *H01L 21/308* | (2006.01) | |
| *H01L 27/108* | (2006.01) | |

(52) U.S. Cl.
CPC .... *H01L 21/31116* (2013.01); *G03F 7/70033* (2013.01); *H01L 21/0332* (2013.01); *H01L 21/3081* (2013.01); *H01L 21/31144* (2013.01); *H01L 27/10894* (2013.01)

(58) Field of Classification Search
CPC ........... H01L 21/31116; H01L 21/0332; H01L 21/3081; H01L 21/31144; H01L 27/10808; G03F 7/70033
See application file for complete search history.

(56) References Cited

U.S. PATENT DOCUMENTS

| | | | | |
|---|---|---|---|---|
| 5,989,952 | A | * | 11/1999 | Jen .......................... C12Q 1/48 257/E21.02 |
| 7,642,017 | B2 | | 1/2010 | Huh et al. |
| 8,187,774 | B2 | | 5/2012 | Jeong |
| 8,673,521 | B2 | | 3/2014 | Choi |

(Continued)

FOREIGN PATENT DOCUMENTS

| | | |
|---|---|---|
| KR | 101179518 B1 | 9/2012 |
| KR | 101485754 B1 | 1/2015 |

*Primary Examiner* — Yu-Hsi D Sun
(74) *Attorney, Agent, or Firm* — Harness, Dickey & Pierce, P.L.C.

(57) ABSTRACT

Example embodiments relate to a method for fabricating a semiconductor device. The method for fabricating a semiconductor device includes stacking on a substrate an etching target layer, a first mask layer, and a photoresist layer, irradiating extreme ultraviolet (EUV) radiation on the photoresist layer to form a photoresist pattern, patterning the first mask layer to form a first mask pattern using the photoresist pattern as an etching mask, and patterning the etching target layer to form a target pattern using the first mask pattern as an etching mask. The first mask layer includes at least one of a silicon layer and a titanium oxide layer.

6 Claims, 30 Drawing Sheets

(56) References Cited

U.S. PATENT DOCUMENTS

| | | |
|---|---|---|
| 8,679,707 B2 | 3/2014 | Lee et al. |
| 9,005,873 B2 | 4/2015 | Sakamoto et al. |
| 9,304,390 B2 | 4/2016 | Lu et al. |
| 9,304,396 B2 | 4/2016 | Shamma et al. |
| 9,305,834 B1 | 4/2016 | Latypov et al. |
| 2004/0192009 A1* | 9/2004 | Belyansky ........ H01L 21/76224 |
| | | 438/424 |
| 2012/0040528 A1* | 2/2012 | Kim .................. H01L 21/76816 |
| | | 438/675 |
| 2014/0268092 A1 | 9/2014 | Lu et al. |
| 2015/0309401 A1 | 10/2015 | Lin et al. |
| 2017/0012139 A1* | 1/2017 | Sasagawa ......... H01L 29/78693 |
| 2017/0062222 A1* | 3/2017 | Yang .................. H01L 21/2658 |
| 2017/0227850 A1* | 8/2017 | Nishimaki ................ G03F 7/11 |

* cited by examiner

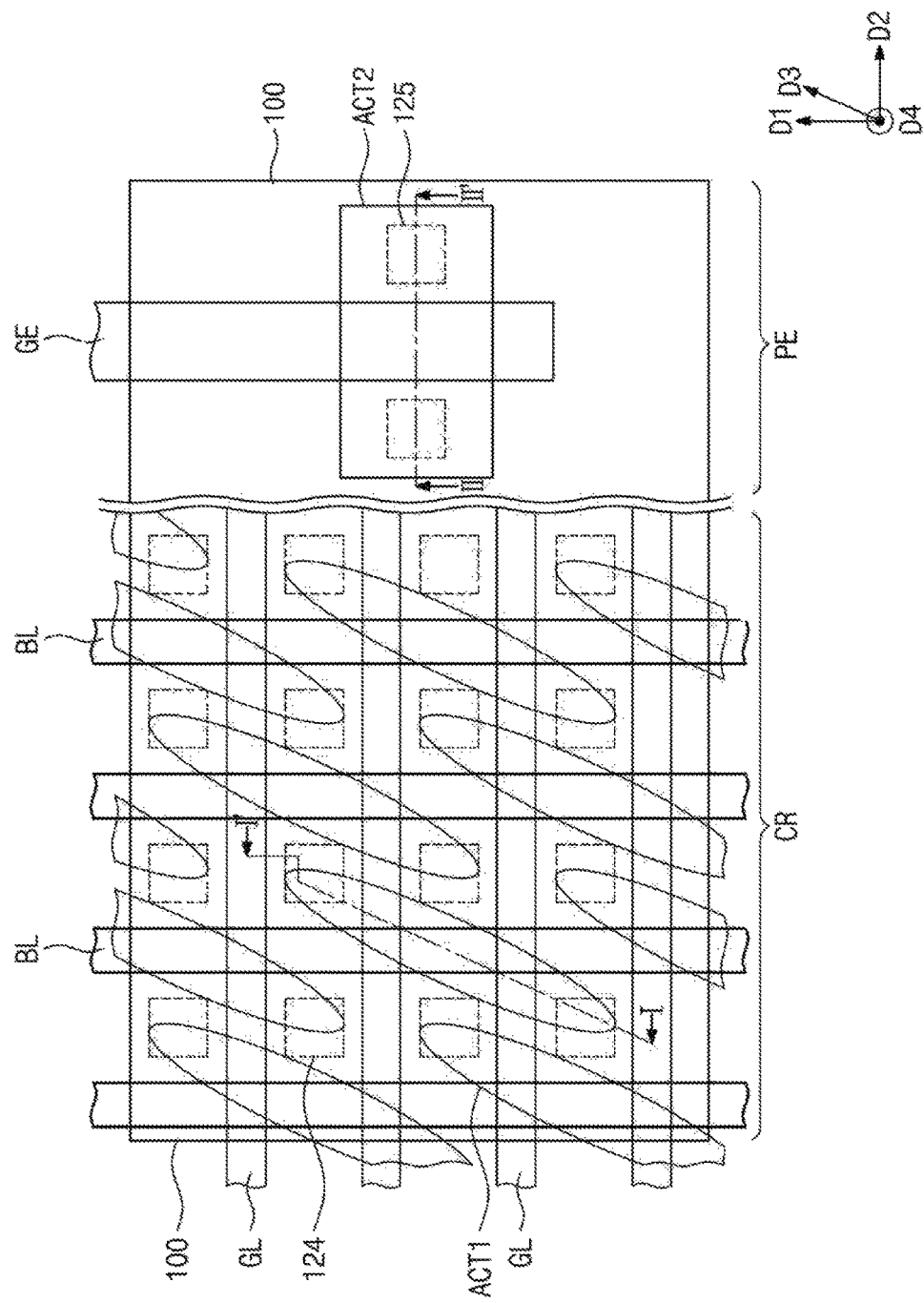

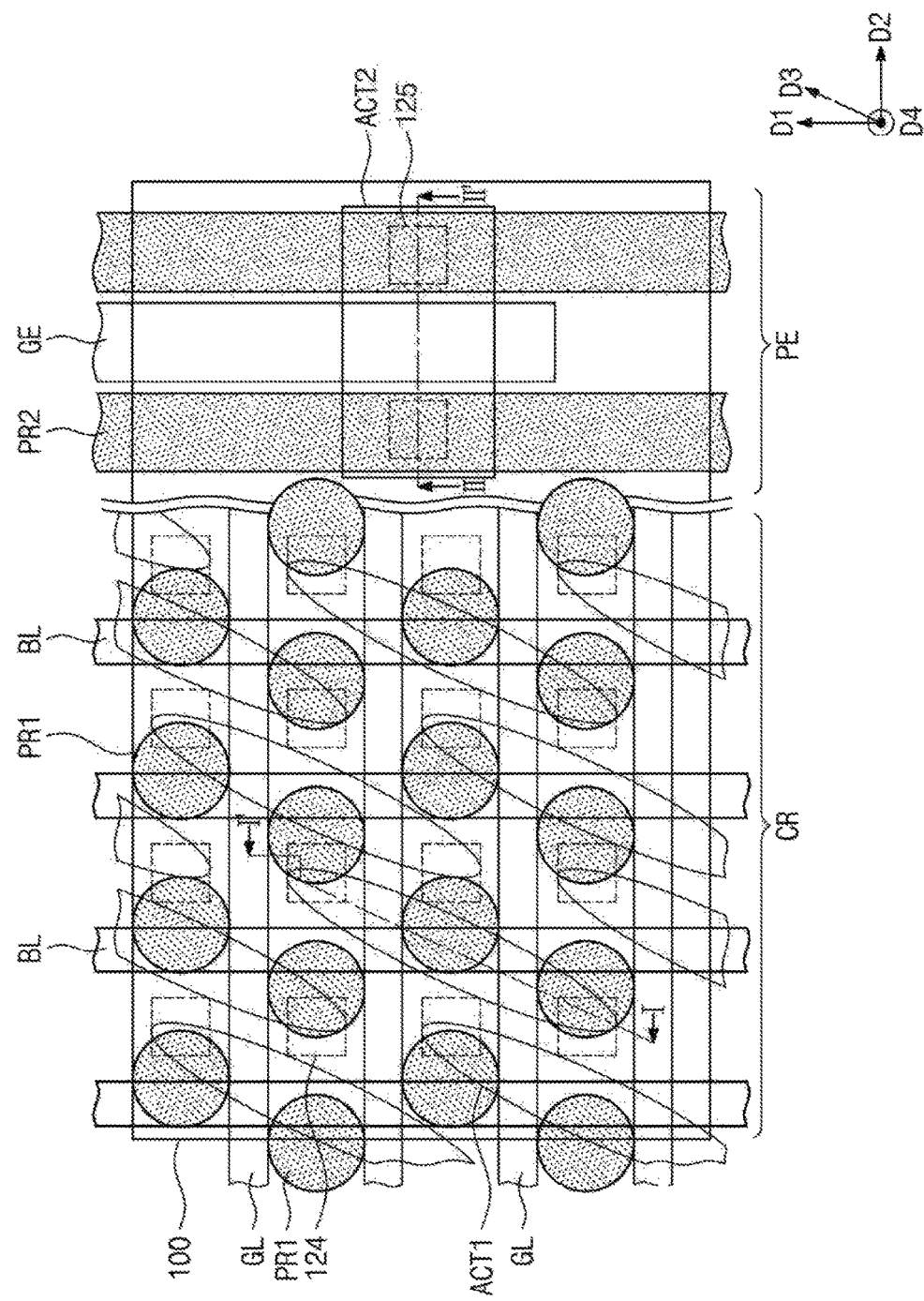

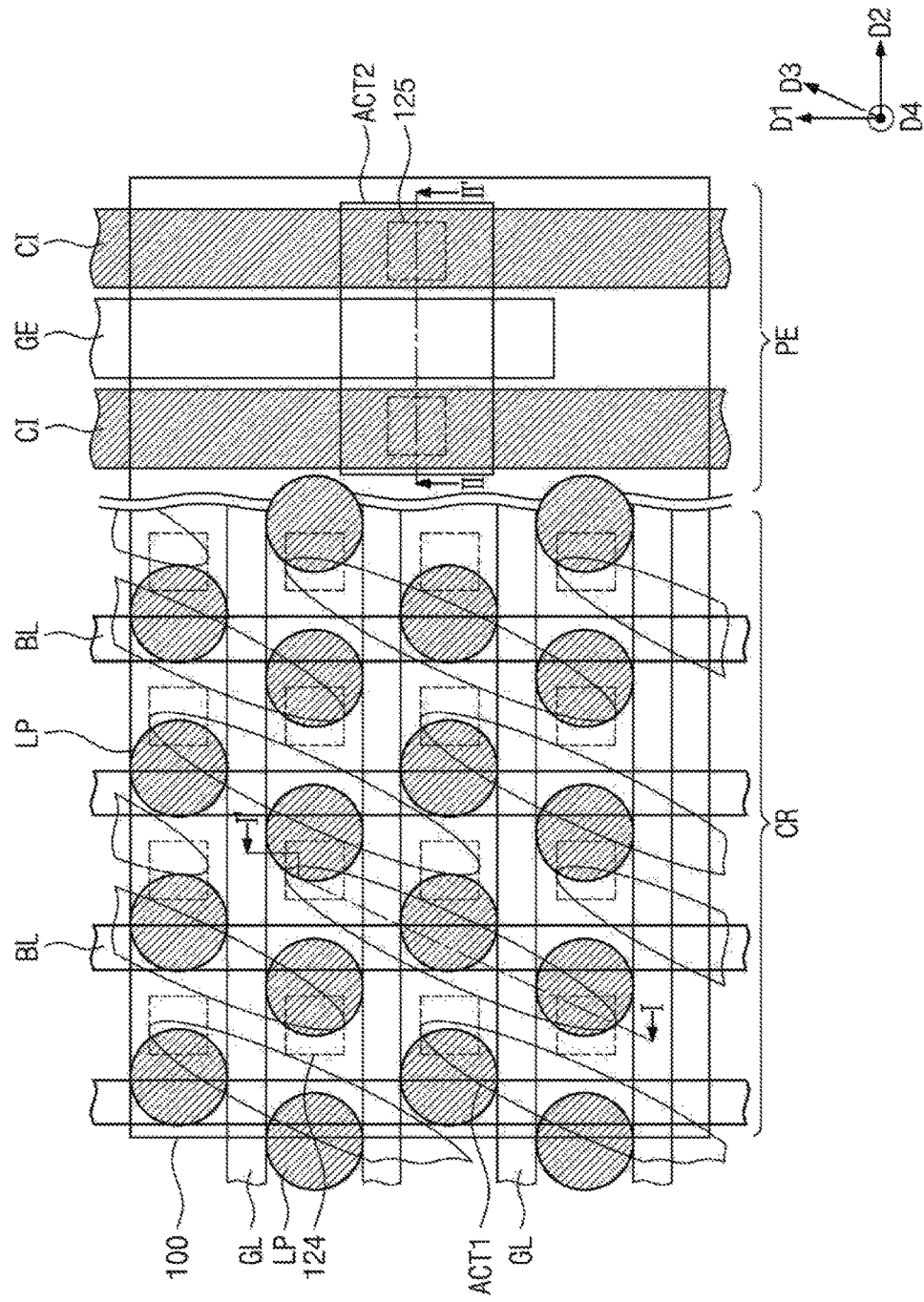

METHODS FOR FABRICATING SEMICONDUCTOR DEVICES USING A MULTILAYER LITHOGRAPHY PROCESS

CROSS-REFERENCE TO RELATED APPLICATIONS

This U.S. non-provisional patent application claims priority under 35 U.S.C § 119 to Korean Patent Application 10-2016-0095592 filed on Jul. 27, 2016, the entire contents of which are hereby incorporated by reference.

BACKGROUND

The inventive concepts relate to a method for fabricating a semiconductor device and, more particularly, to a method for fabricating a semiconductor device using an extreme ultraviolet (EUV) photolithography process.

Semiconductor devices are widely used in the electronic industry because of their small size, multi-function, and/or low fabrication cost. A semiconductor device may include a memory device for storing data, a logic device for processing data, and a hybrid device for operating various functions contemporaneously or simultaneously.

Semiconductor devices have been progressively utilized for high integration with the development of the electronic industry. It is increasingly difficult to fabricate the semiconductor device because there may be some challenges of process margin reduction in an exposure process defining fine patterns. Various researches have been conducted for achieving the advantages of high integration and/or high speed in the semiconductor device.

FIG. 7 shows a comparative example where a substrate SB is provided thereon with an etching target layer ET, a first mask layer HM1 and a second mask layer HM2, where a first etching process EP1 is performed on the second mask layer HM2. The second mask layer HM2 may include a silicon oxynitride (SiON) layer.

SUMMARY

Embodiments of the inventive concepts provide a method for forming a target pattern using a mask layer having a high etch selectivity with respect to a photoresist pattern.

Embodiments of the inventive concepts provide a method for fabricating a semiconductor device using a mask layer having a high etch selectivity with respect to a photoresist pattern.

According to some example embodiments of the inventive concepts, a method for fabricating a semiconductor device may include forming on a substrate an etching target layer, a first mask layer, and a photoresist layer that are stacked, for example sequentially stacked; irradiating an extreme ultraviolet (EUV) radiation on the photoresist layer to form a photoresist pattern; patterning the first mask layer to form a first mask pattern using the photoresist pattern as an etching mask; and patterning the etching target layer to form a target pattern using the first mask pattern as an etching mask. The first mask layer may comprise at least one of a silicon layer and a titanium oxide layer.

According to some example embodiments of the inventive concepts, a method for fabricating a semiconductor device may include forming a gate line to run across an active pattern of a first region of a substrate; forming a first impurity region and a second impurity region in the active pattern on opposite sides of the gate line; forming on the substrate an interlayer dielectric layer, a conductive layer, and a first mask layer that are stacked, for example sequentially stacked; forming a photoresist pattern on the first mask layer; patterning the first mask layer to form a first mask pattern using the photoresist pattern as an etching mask; and patterning the conductive layer using the first mask pattern as an etching mask to form a first conductive pattern electrically connected to the first impurity region. The first mask layer may comprise at least one of a silicon layer and a titanium oxide layer.

Some example embodiments relate to a method for fabricating a semiconductor device, the method including forming a photoresist pattern by using extreme ultraviolet (EUV) radiation, forming a first mask pattern using the photoresist pattern as an etching mask, and forming a target pattern using the first mask pattern as an etching mask, wherein the first mask pattern includes at least one of silicon and titanium oxide.

BRIEF DESCRIPTION OF THE DRAWINGS

FIGS. 8A, 9A and 10A are plan views illustrating a method for fabricating a semiconductor device according to example embodiments of the inventive concepts.

DETAILED DESCRIPTION OF EMBODIMENTS

Figure 1:
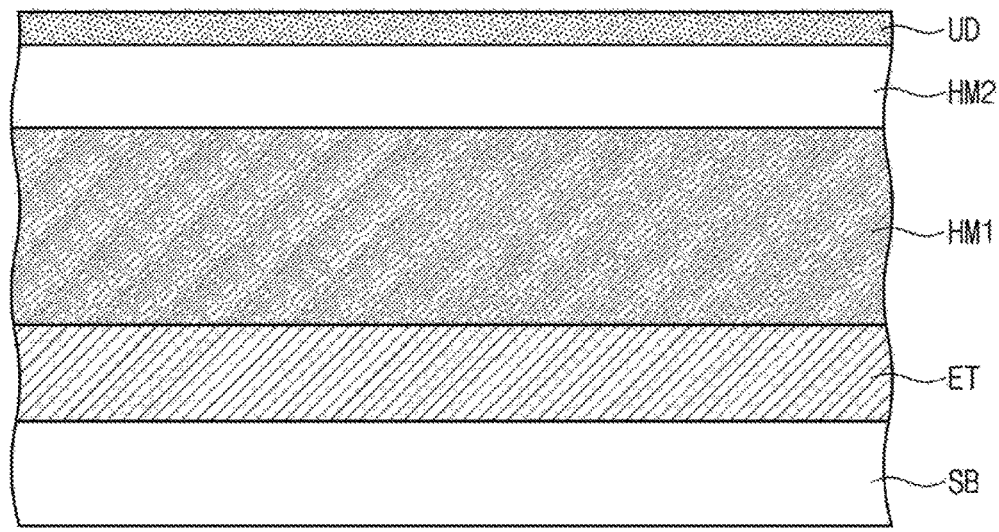
FIGS. 1, 2, 3, 5 and 6 are cross-sectional views illustrating a method for forming a target pattern according to example embodiments of the inventive concepts.

These and other features and advantages are described in, or are apparent from, the following detailed description of various example embodiments.

In the drawing figures, the dimensions of layers and regions may be exaggerated for clarity of illustration. Like reference numerals refer to like elements throughout. The same reference numbers indicate the same components throughout the specification.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the example embodiments may be cylindrical, other tubular cross-sectional forms are contemplated, such as square, rectangular, oval, triangular and others.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIGS. 1, 2, 3, 5 and 6 are cross-sectional views illustrating a method for forming a target pattern according to example embodiments of the inventive concepts. FIG. 4 is a cross-sectional view describing a first etching process of FIG. 3.

Referring to FIG. 1, a substrate SB may be provided thereon with an etching target layer ET, a first mask layer HM1, a second mask layer HM2, and an under layer UD that are stacked, for example sequentially stacked on the substrate SB. For example, the substrate SB may be a silicon substrate, a germanium substrate, or a silicon-germanium substrate. The etching target layer ET may include a conductive material or an insulating material. The conductive material may include at least one of a semiconductor material (e.g., doped silicon, doped germanium, etc.), a conductive metal nitride (e.g., titanium nitride, tantalum nitride, etc.), a metal (e.g., tungsten, titanium, tantalum, etc.), and a metal-semiconductor compound (e.g., tungsten silicide, cobalt silicide, titanium silicide, etc.). The insulating material may include at least one of a silicon oxide layer, a silicon nitride layer, and a silicon oxynitride layer.

The first mask layer HM1 may include an SOH (Spin On Hardmask) layer, an SOC (Spin On Carbon) layer, or an amorphous carbon layer. The second mask layer HM2 may include a silicon (Si) layer, a silicon oxide ($SiO_2$) layer, a silicon nitride ($Si_3N_4$) layer, or a metal layer. The metal layer may include a titanium (Ti) layer, a tungsten (W) layer, a titanium oxide ($TiO_2$) layer, or a titanium nitride (TiN) layer. In more detail, the second mask layer HM2 may include a silicon layer, a titanium oxide layer, or a combination thereof. An example of the combination thereof may include a multiple layer in which the silicon layer and the titanium oxide layer are stacked, for example sequentially stacked. The silicon layer may be an amorphous silicon layer, a single crystalline silicon layer, or a polycrystalline silicon layer.

The under layer UD may adhere photoresist patterns PR, which are discussed below, to the second mask layer HM2. The under layer UD may include an organic polymer that can enhance an adhesive property of the photoresist patterns PR. The under layer UD may include, for example, a novolac-based organic polymer. Alternatively, the under layer UD may be omitted.

Figure 2:
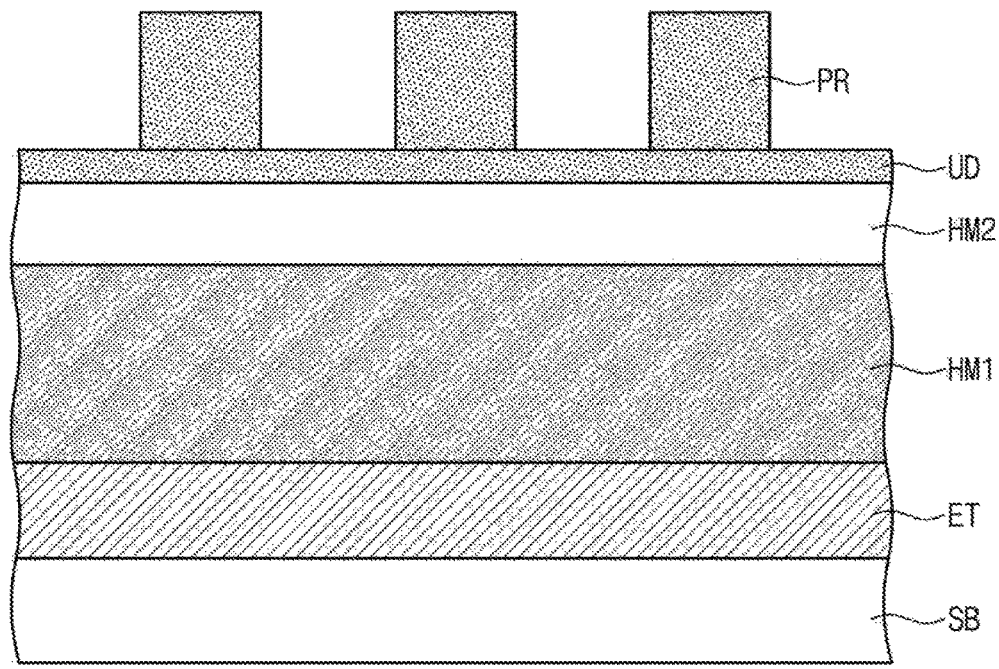

Referring to FIG. 2, photoresist patterns PR may be formed on the under layer UD. In case the under layer UD is omitted, the photoresist patterns PR may be directly formed on the second mask layer HM2. The formation of the photoresist patterns PR may include forming a photoresist layer on the under layer UD and performing an exposure and development process using an extreme ultraviolet (EUV) radiation on the photoresist layer. For example, the EUV radiation may have a wavelength of about 13.5 nm so that it may be possible to form the photoresist patterns PR having a fine pitch.

The photoresist layer may include but not especially limited to a synthetic resin and a photosensitive compound that can be exposed by the EUV radiation. As viewed in plan, the photoresist patterns PR may have but not limited to a line shape or an island shape.

Figure 3:
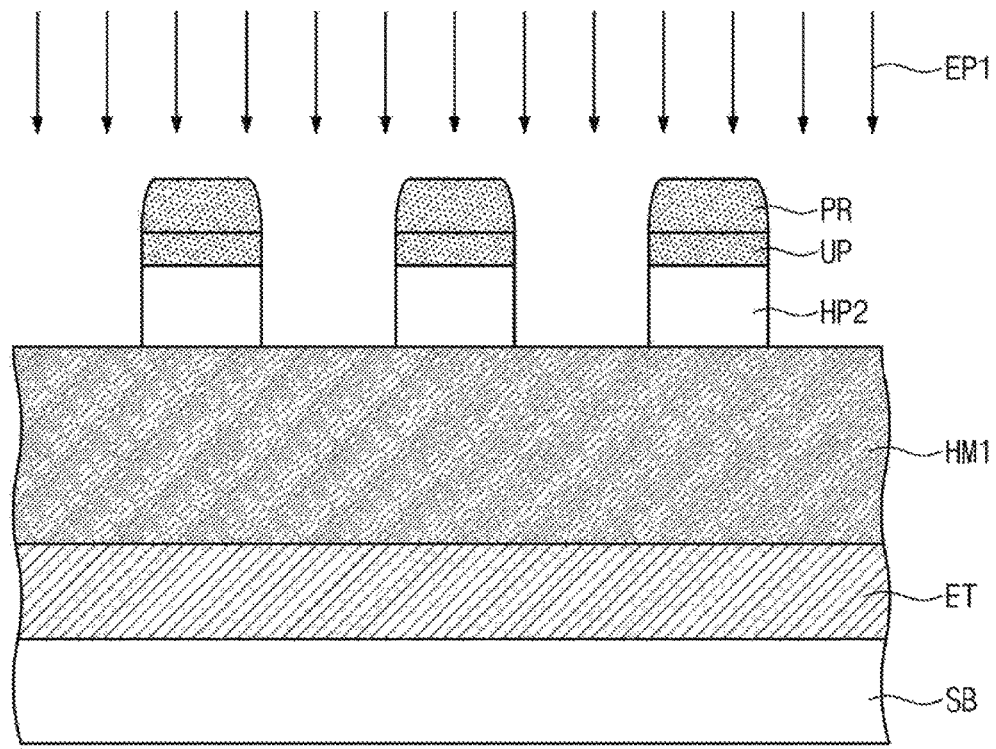
Figure 4:
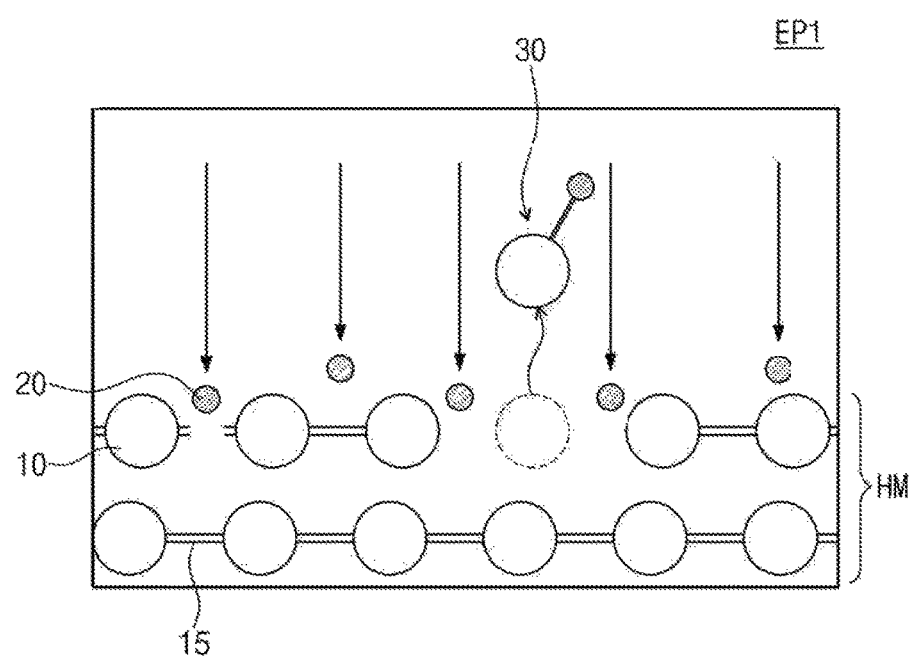
FIG. 4 is a cross-sectional view describing a first etching process of FIG. 3.

Referring to FIGS. 3 and 4, the under layer UD and the second mask layer HM2 may be patterned, for example sequentially patterned using the photoresist patterns PR as an etching mask so as to form under patterns UP and second mask patterns HP2. In detail, a first etching process EP1 may be performed to etch the under layer UD and the second mask layer HM2.

The first etching process EP1 may be a dry etching process using plasma. An etching gas of the first etching process EP1 may include at least one of $SF_6$, HBr, and $BCl_3$. The etching gas may further include a CHF-based etching material (e.g., $CHF_3$, $CH_2F_2$, $CH_3F$, $CH_4$, $C_4F_6$, or $C_4F_8$).

Referring back to FIG. 4, the second mask layer HM2 may include a bond 15 between first atoms 10. The first atoms 10 may be atoms constituting the second mask layer HM2. For example, in case the second mask layer HM2 is a silicon layer, the first atoms 10 may include Si atoms. Alternatively, in case the second mask layer HM2 is a titanium oxide layer, the first atoms 10 may include Ti atoms and O atoms.

A surface of the second mask layer HM2 may be collided with plasma ions 20 generated from the etching gas that are accelerated into the second mask layer HM2 In this case, the bond 15 between the first atoms 10 may be broken by the physical impact energy of the plasma ions 20. The plasma ions 20 may undergo a chemical reaction with atoms released from the broken bond 15 between the first atoms 10 so that volatile compounds 30 may be formed. The second mask layer HM2 may be etched by the physical and chemical mechanisms discussed above.

In case the second mask layer HM2 is a silicon layer or a titanium oxide layer, the second mask layer HM2 may include the first atoms 10 whose binding energy is relatively low. Therefore, the bond 15 between the first atoms 10 may be easily broken even when the plasma ions 20 are relatively slowly accelerated. In this case, the physical impact energy of the plasma ions 20 may become relatively low, and thus the photoresist patterns PR whose binding energy is relatively higher than the binding energy of the second mask layer HM2 may remain as an etching mask without a great loss during the first etching process EP1.

Figure 7:
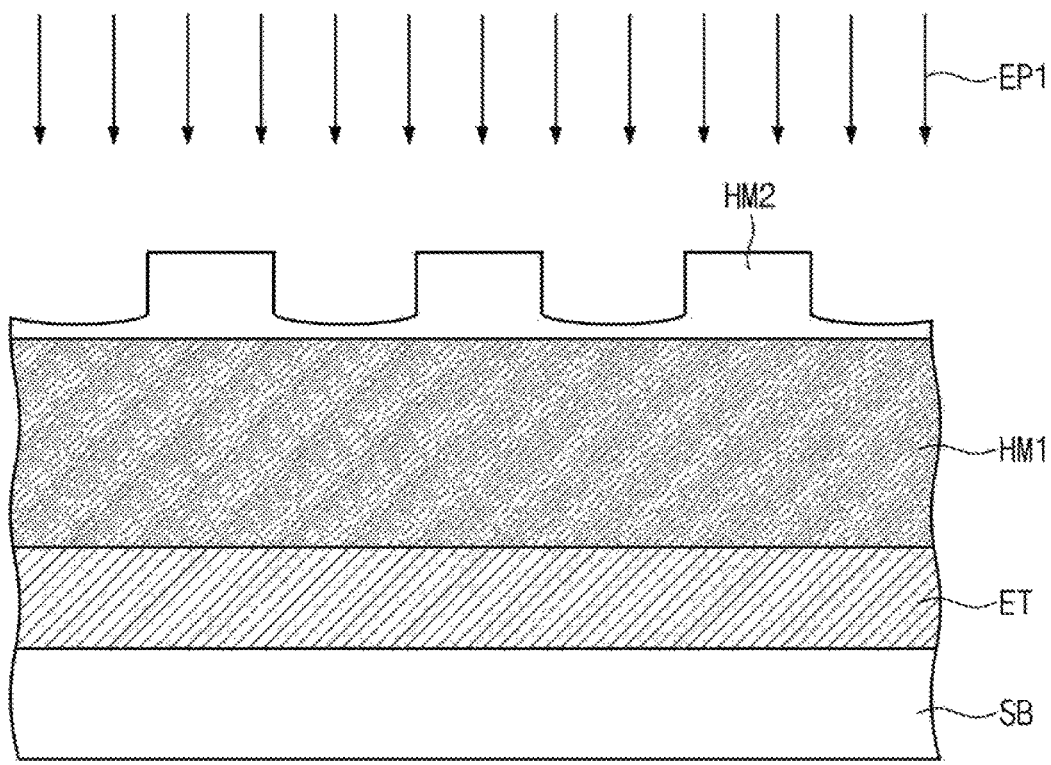
FIG. 7 is a cross-sectional view illustrating a comparative example.

FIG. 7 shows that the first etching process EP1 is performed on the second mask layer HM2 according to a comparative example. Differently from that discussed above with reference to FIGS. 1 to 3, the second mask layer HM2 may include a silicon oxynitride (SiON) layer. The silicon oxynitride layer may be used as a mask layer for preventing light reflection in a photolithography process using a light source such as ArF. The silicon oxynitride layer may have atomic binding energy relatively greater than the binding energy of the aforementioned silicon layer or titanium oxide layer. For etching the second mask layer HM2, it may thus be advantageous to provide the second mask layer HM2 with high impact energy induced by relatively high acceleration of the plasma ions 20 (see FIG. 4). In this case, as the high impact energy is also applied to the photoresist patterns PR, the photoresist patterns PR may be removed in advance before the second mask layer HM2 is partially or completely patterned. As a result, process failure may occur such that the second mask patterns HP1 may be unsatisfactorily formed from the second mask layer HM2.

In a method for forming a target pattern according to example embodiments of the inventive concepts, as the photolithography process uses the EUV, a reflected light may not be generated even when a silicon oxynitride layer is employed as the second mask layer HM2. This may be because the EUV wavelength is so short that optical characteristics (e.g., light reflection) present in an ArF light source are changed in the EUV. In conclusion, example embodiments of the inventive concepts may use a silicon layer or a titanium oxide layer as the second mask layer HM2 and thus have increased etch selectivity with respect to the photoresist patterns PR.

Figure 5:
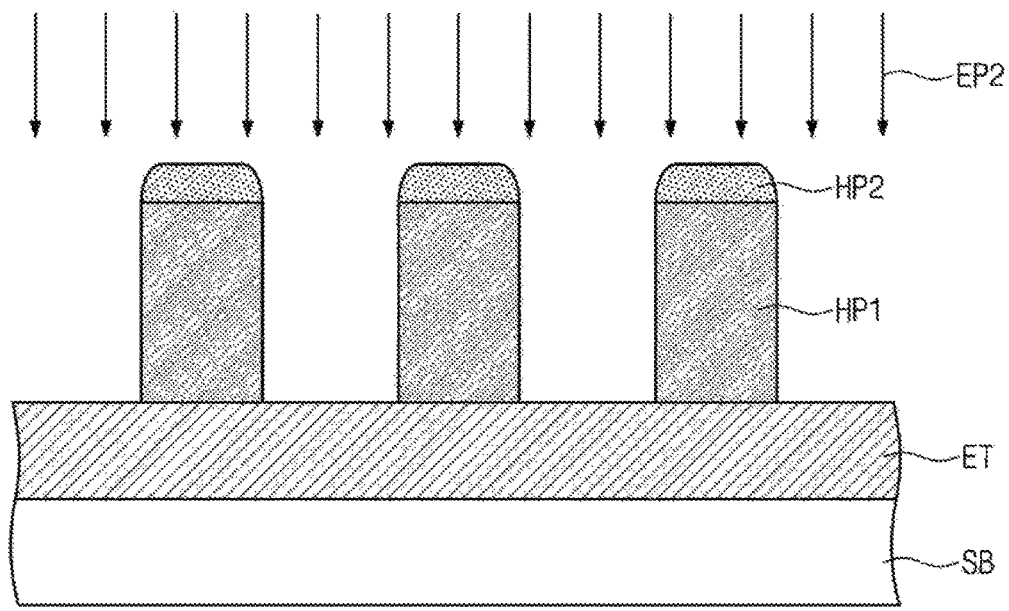

Referring to FIG. 5, first mask patterns HP1 may be formed by etching the first mask layer HM1 using the second mask patterns HP2 as an etching mask. In detail, a second etching process EP2 may be performed to etch the first mask layer HM1. For example, before performing the second etching process EP2, a selective removal may be performed on remaining photoresist patterns PR and the under patterns UP. Alternatively, the remaining photoresist patterns PR and the under patterns UP may be completely removed while the second etching process EP2 is being performed.

The second etching process EP2 may be, for example, a dry etching process. The second etching process EP2 may use an etching gas that can selectively etch the first mask layer HM1. When the second mask patterns HP2 include a silicon layer or a titanium oxide layer, the etching gas may have a high etch selectivity with respect to the first mask layer HM1 consisting of a carbon-containing organic material. Therefore, the second mask patterns HP2 may remain as an etching mask without a great loss during the second etching process EP2.

Figure 6:
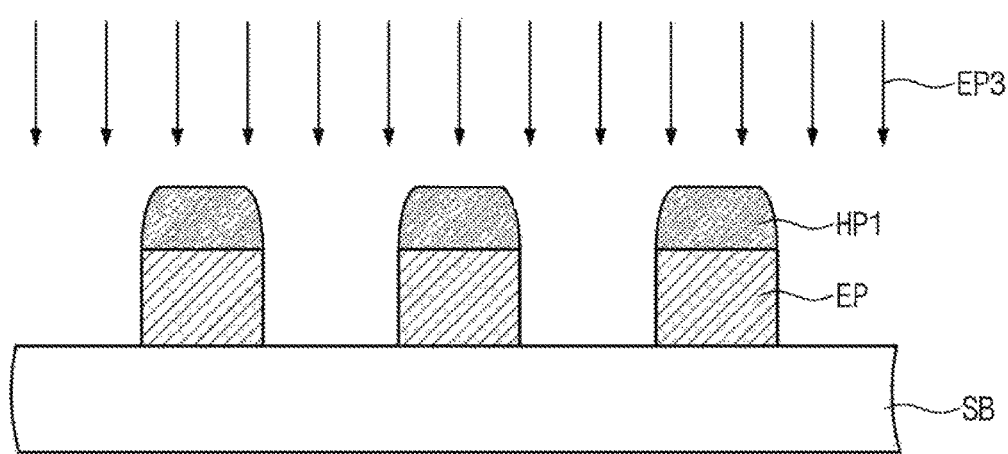

Referring to FIG. 6, target patterns EP may be formed by etching the target layer ET using the first mask patterns HP1 as an etching mask. In detail, a third etching process EP3 may be performed to etch the target layer ET. For example, before performing the third etching process EP3, a selective removal may be performed on remaining second mask patterns HP2. Alternatively, the remaining second mask patterns HP2 may be completely removed while the third etching process EP3 is being performed.

Figure 8B:
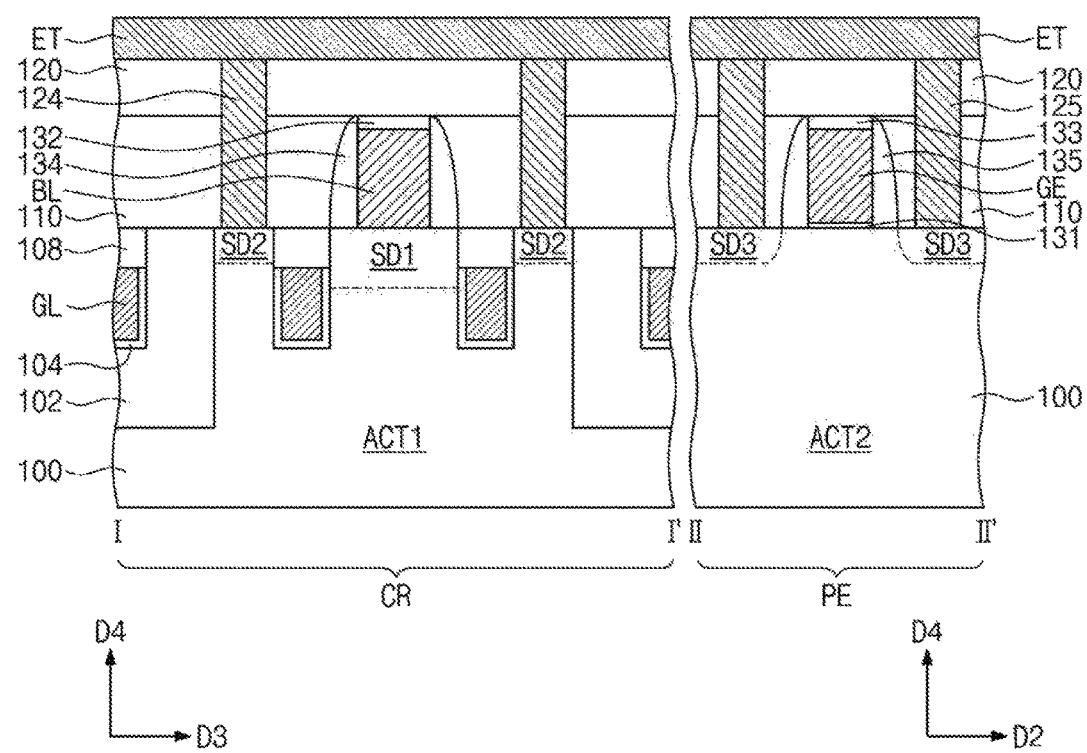
FIGS. 8B, 9B and 10B are cross-sectional views taken along lines I-I' and II-II' of FIGS. 8A, 9A and 10A, respectively.
Figure 9B:
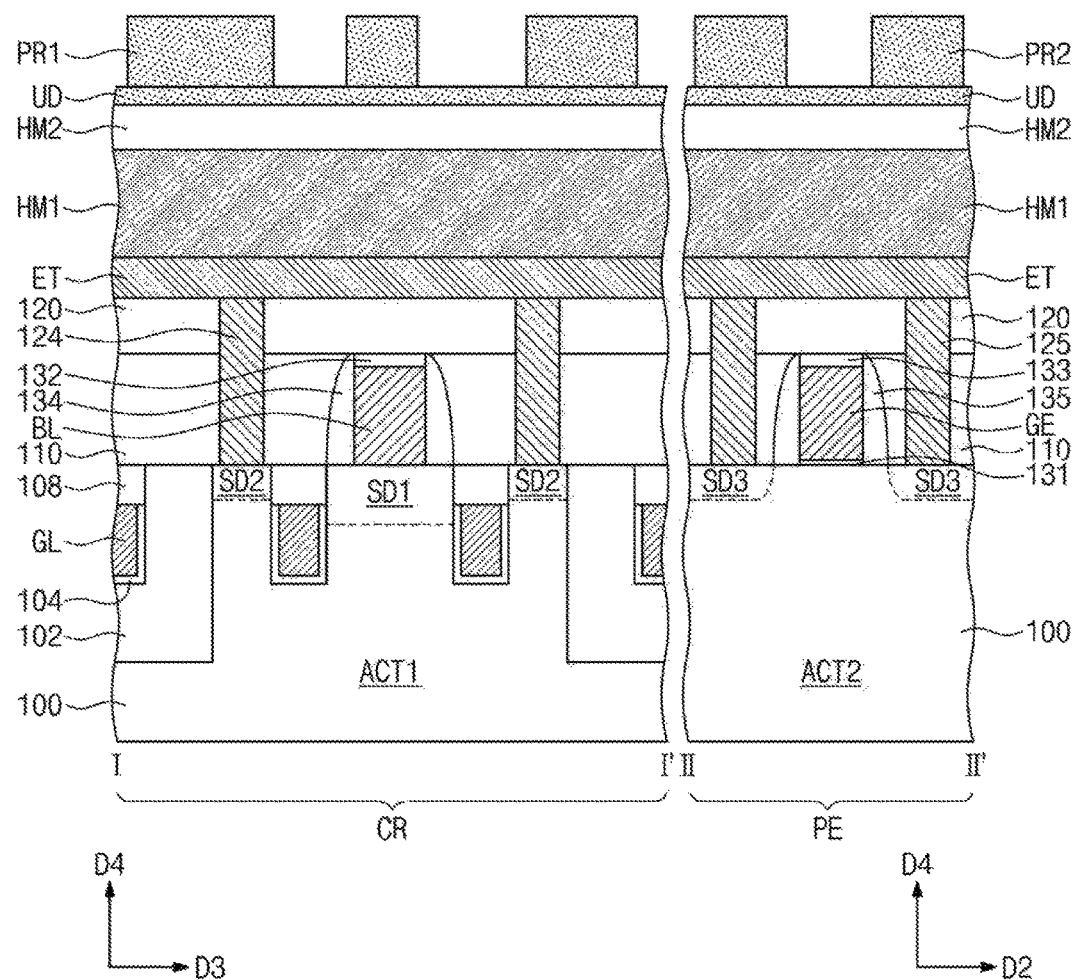
Figure 10B:
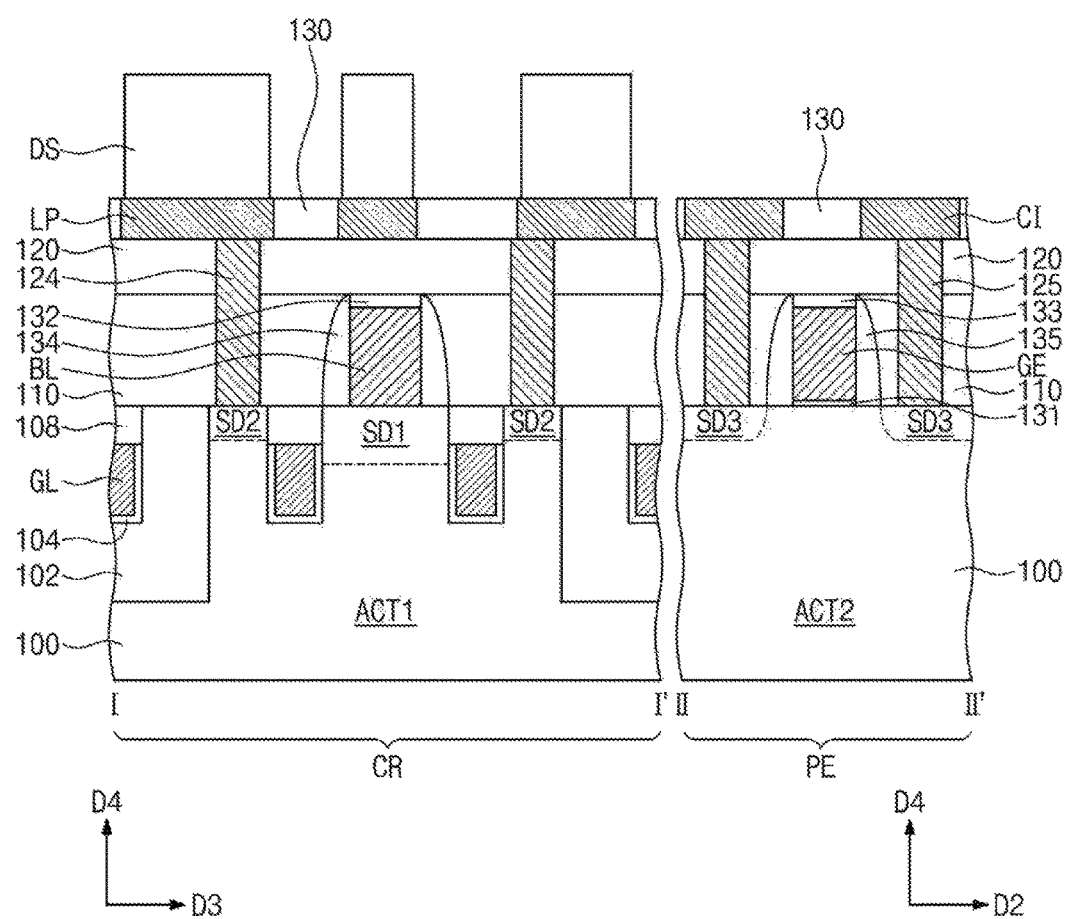
Figure 11A:
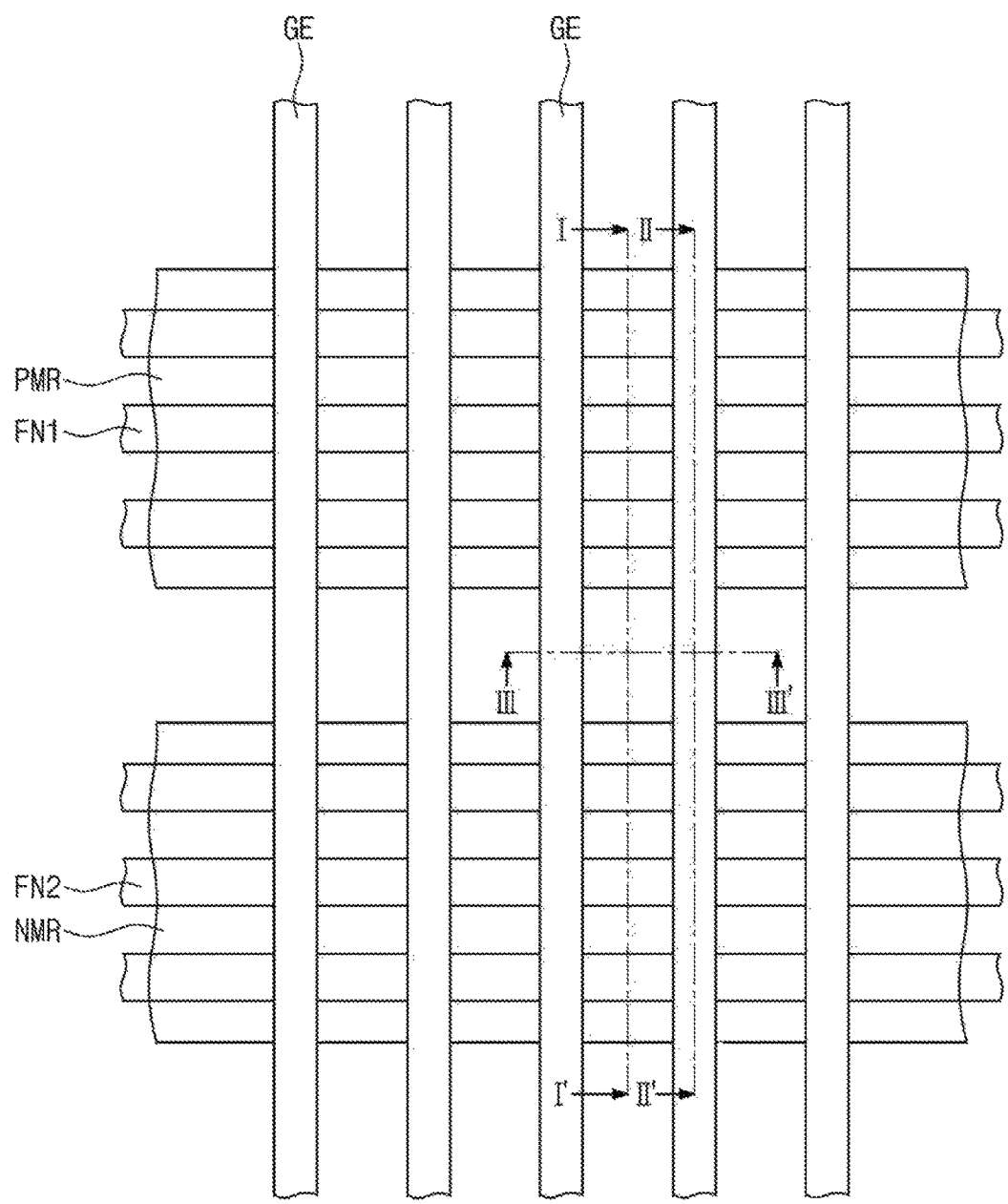
FIGS. 11A, 12A, 13A, 14A and 15A are plan views describing a method for fabricating a semiconductor device according to example embodiments of the inventive concepts.
Figure 11B:
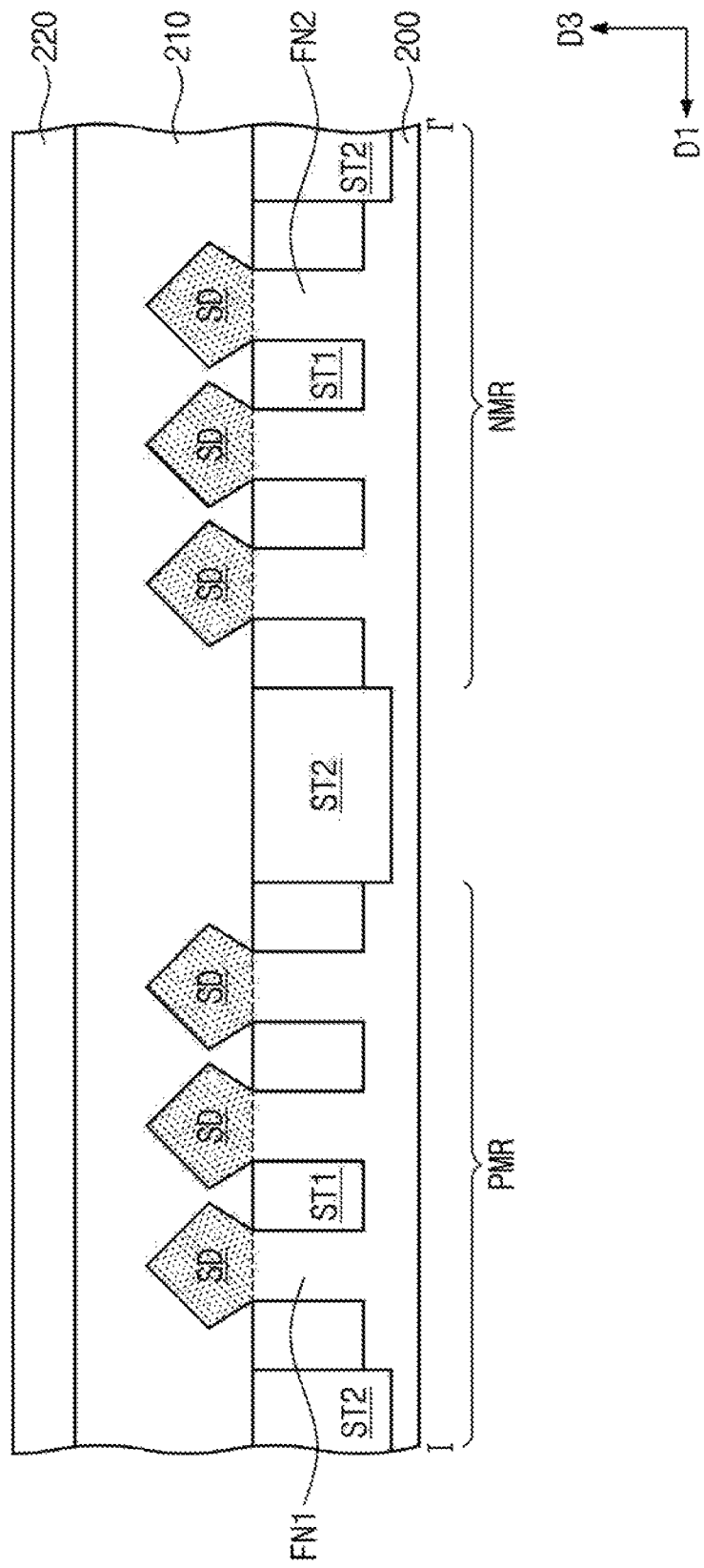
FIGS. 11B, 12B, 13B, 14B and 15B are cross-sectional views taken along line I-I' of FIGS. 11A, 12A, 13A, 14A and 15A, respectively.
Figure 11C:
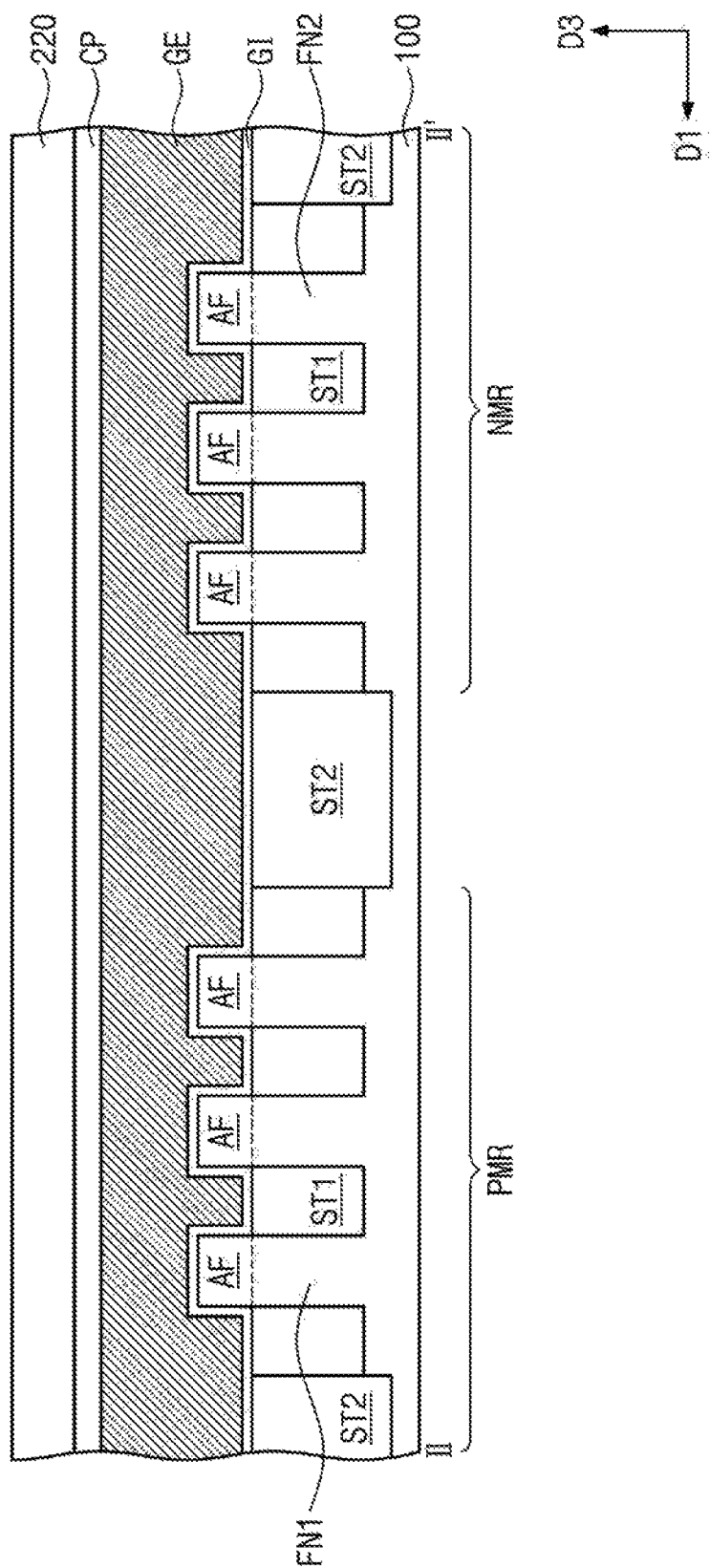
FIGS. 11C, 12C, 13C, 14C and 15C are cross-sectional views taken along line II-II' of FIGS. 11A, 12A, 13A, 14A and 15A, respectively.
Figure 11D:
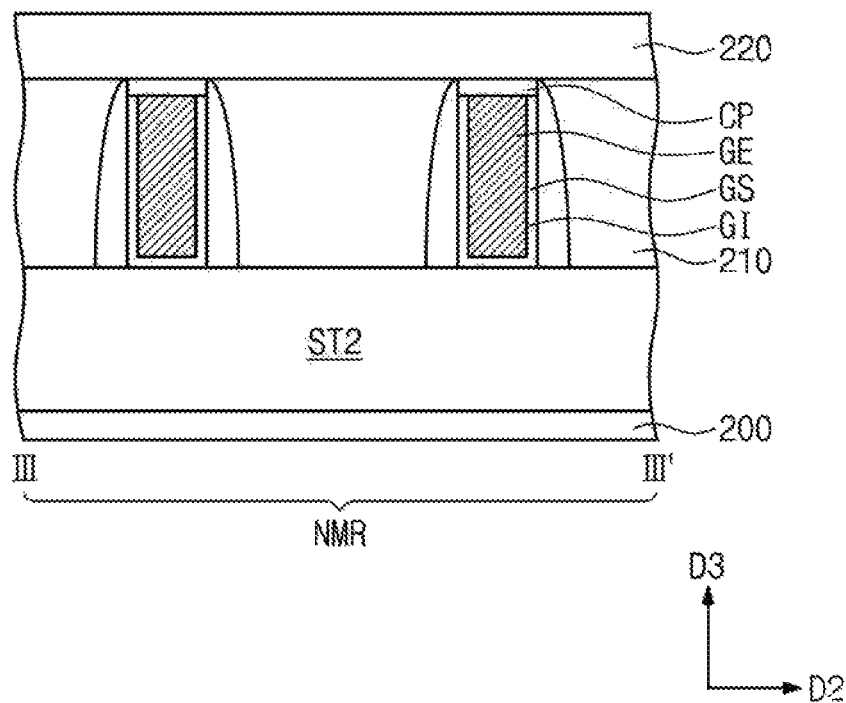
FIGS. 11D, 12D, 13D, 14D and 15D are cross-sectional views taken along line III-III' of FIGS. 11A, 12A, 13A, 14A and 15A, respectively.
Figure 12A:
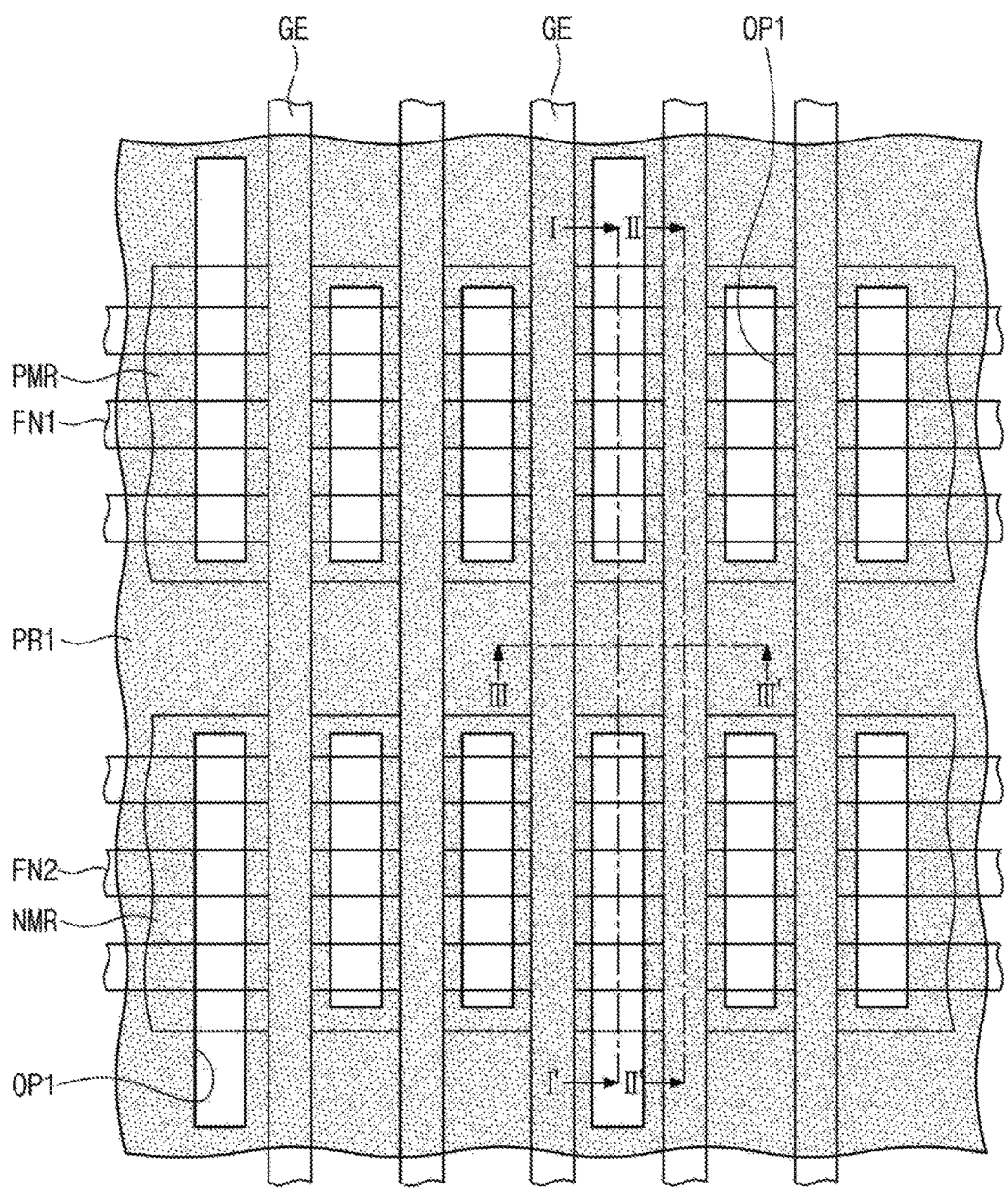
Figure 12B:
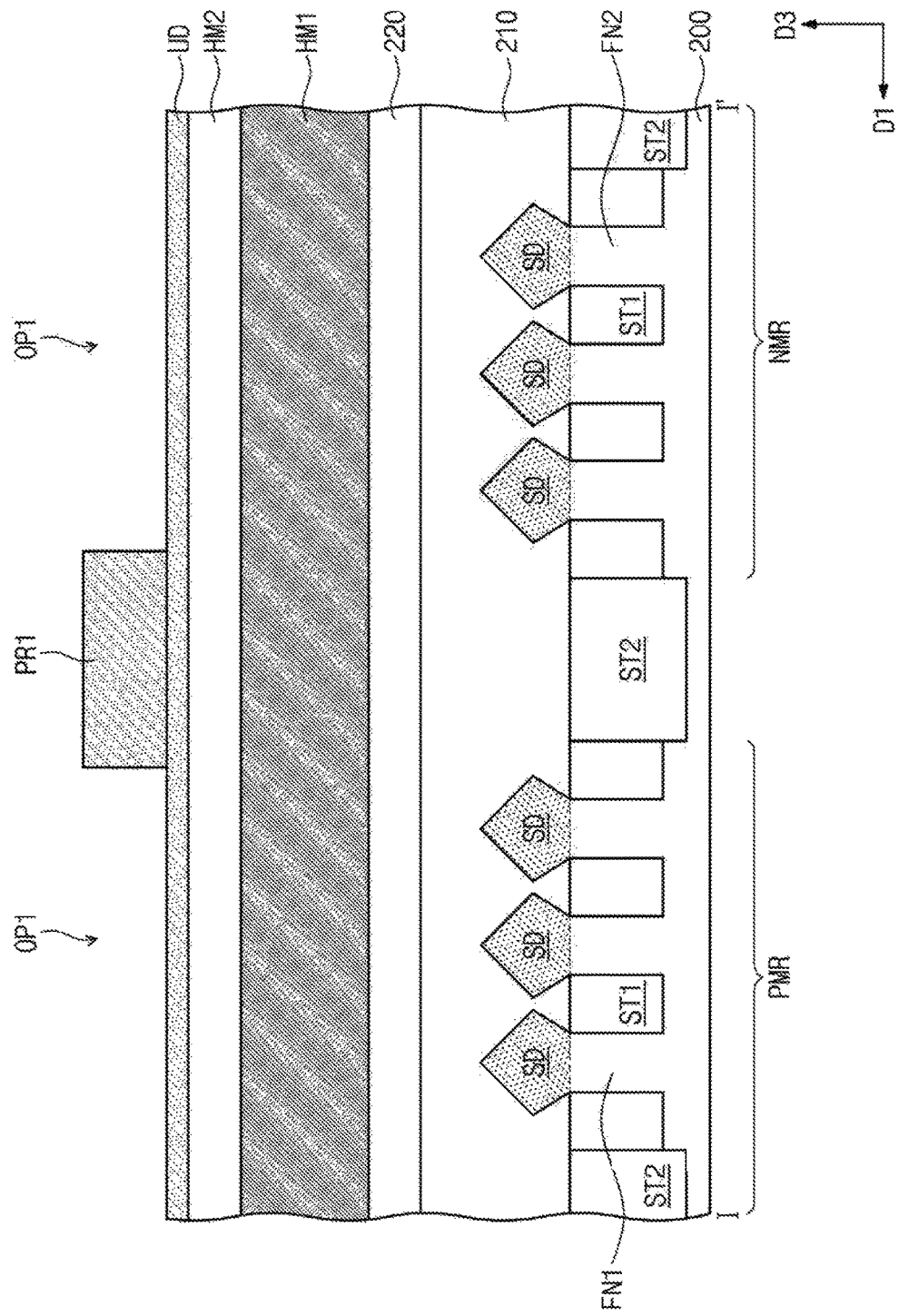
Figure 12C:
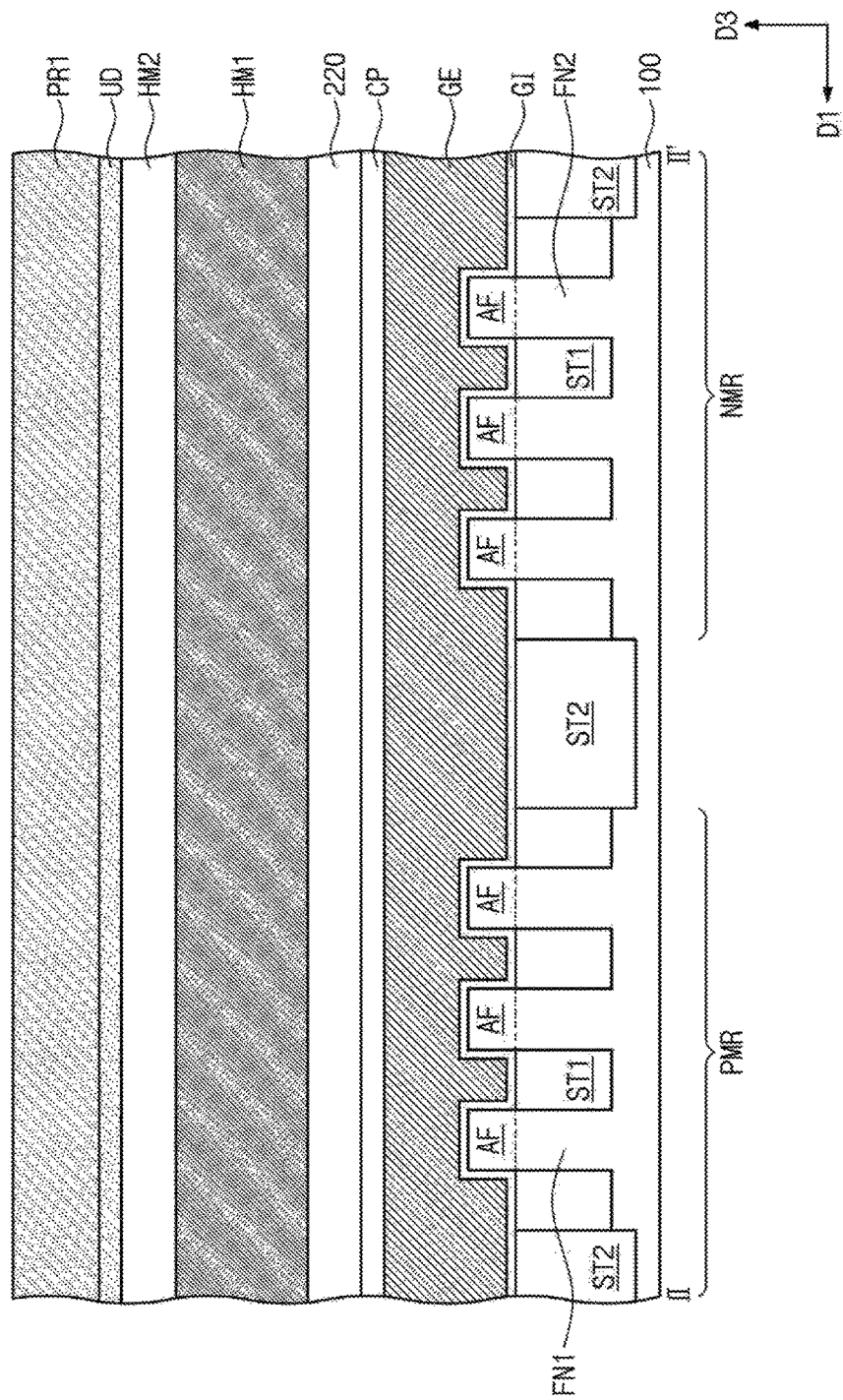
Figure 12D:
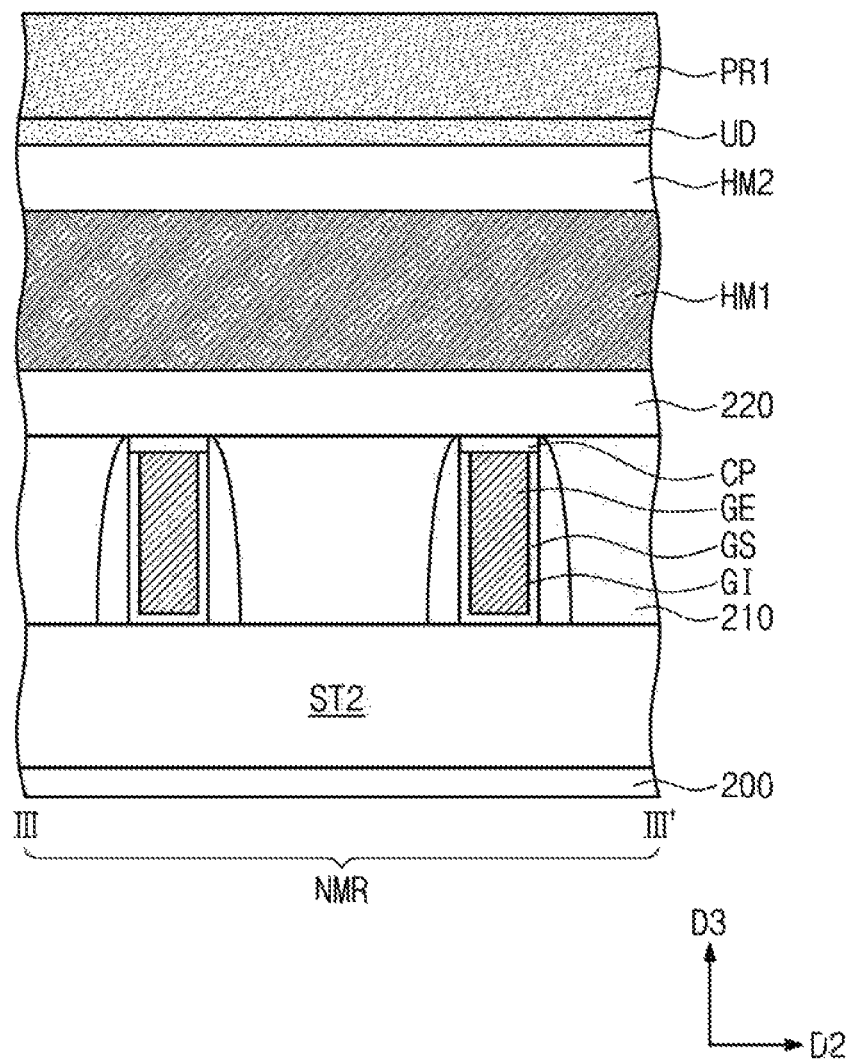
Figure 13A:
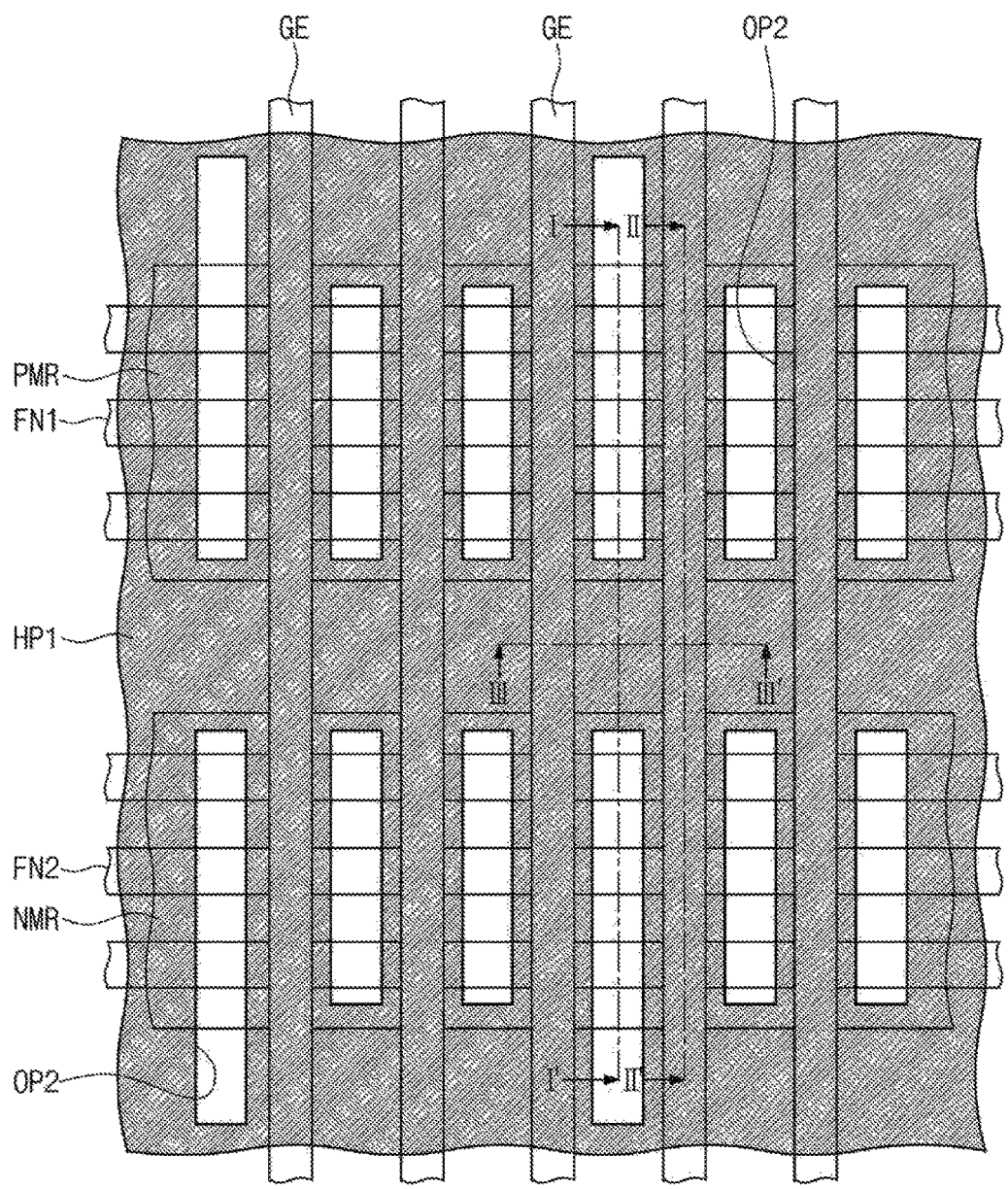
Figure 13B:
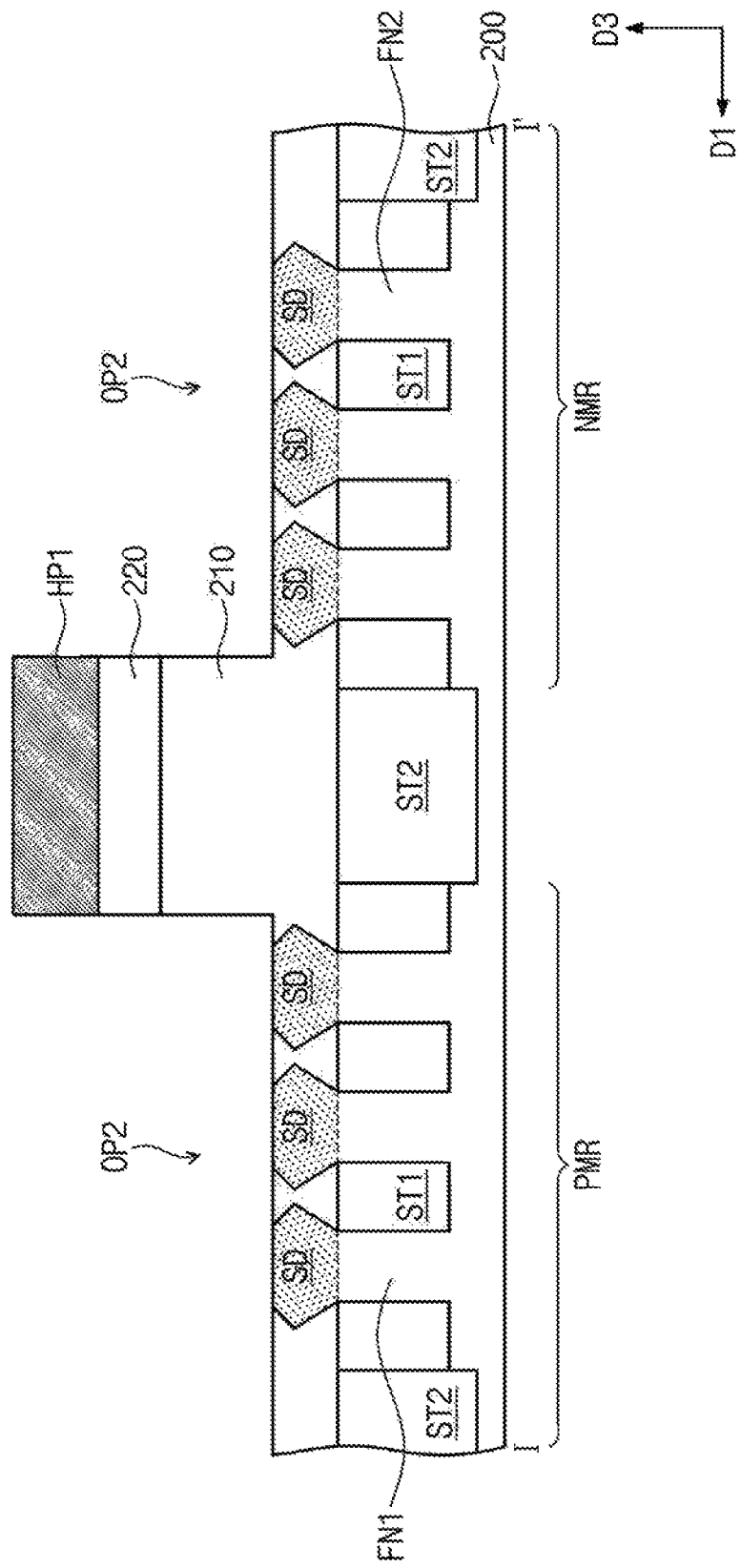
Figure 13C:
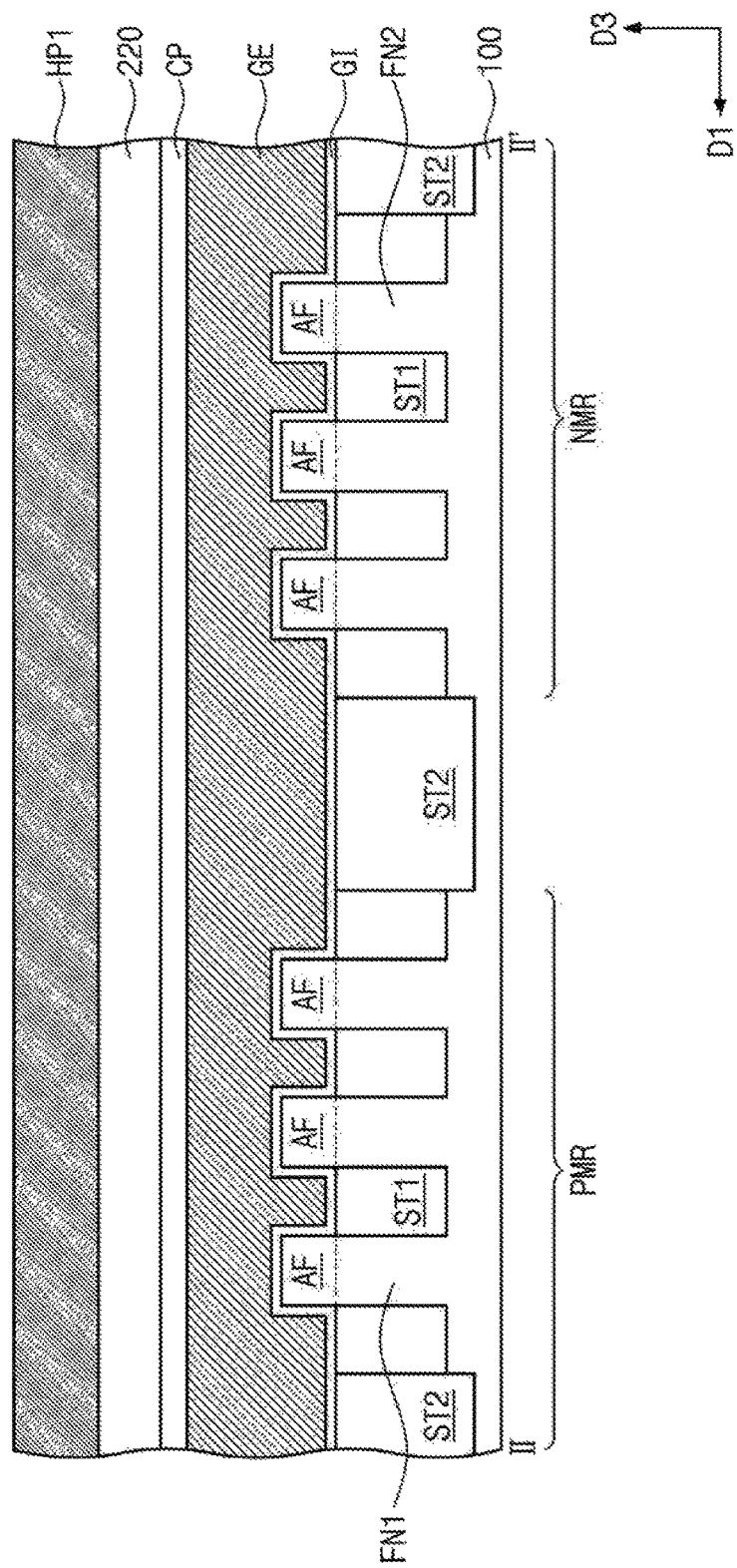
Figure 13D:
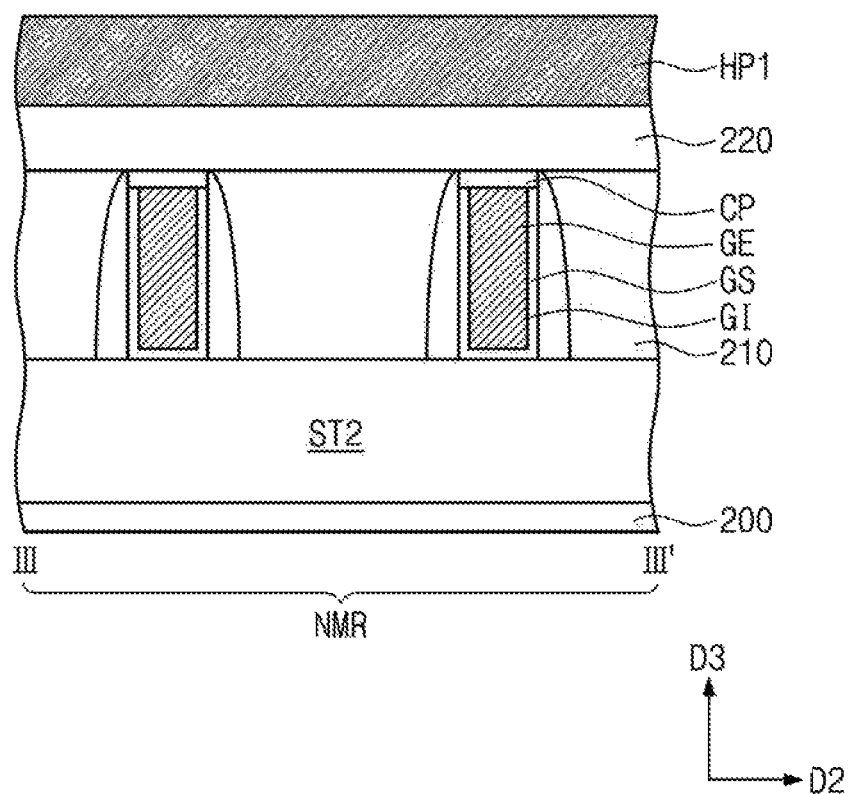
Figure 14A:
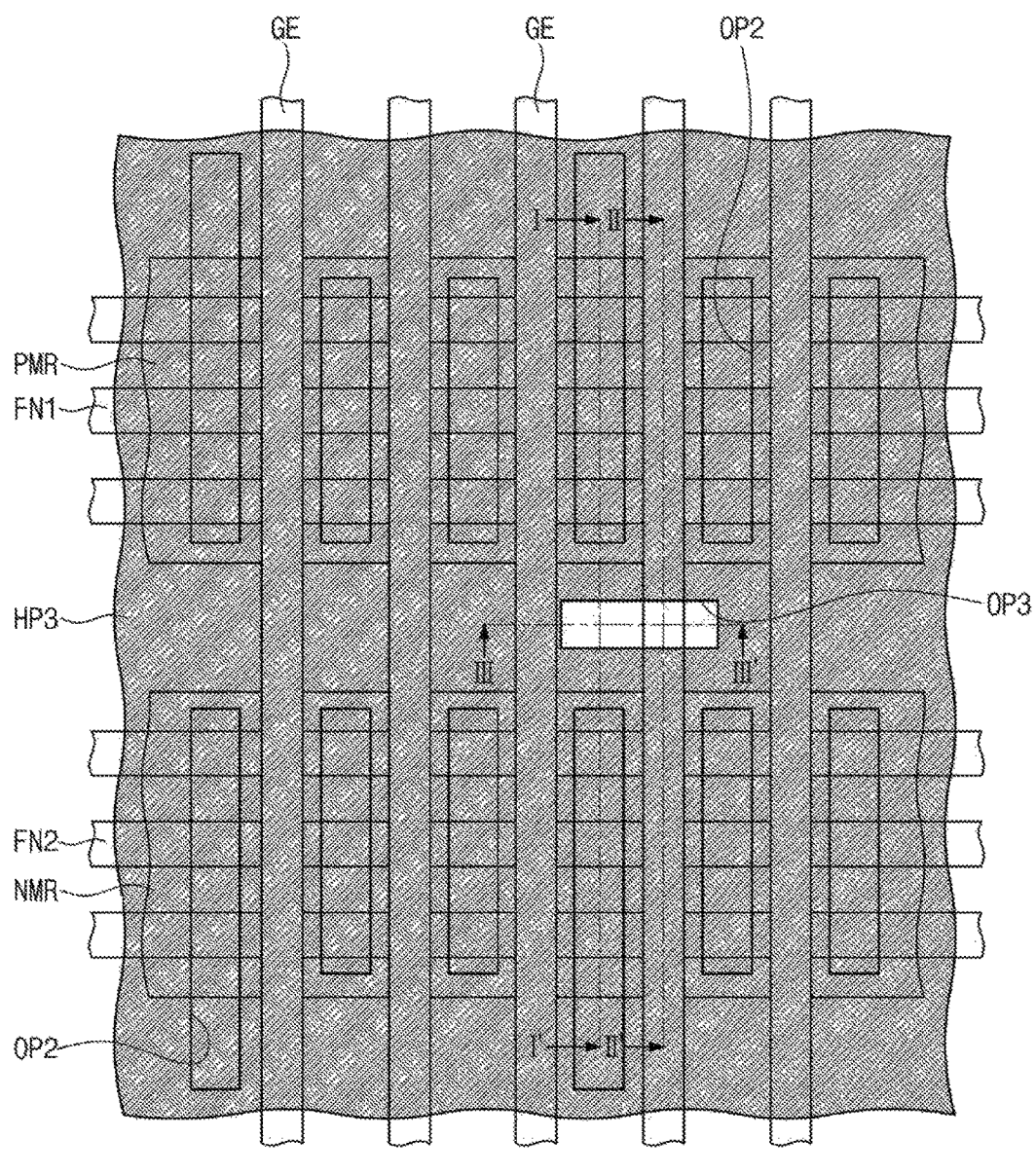
Figure 14B:
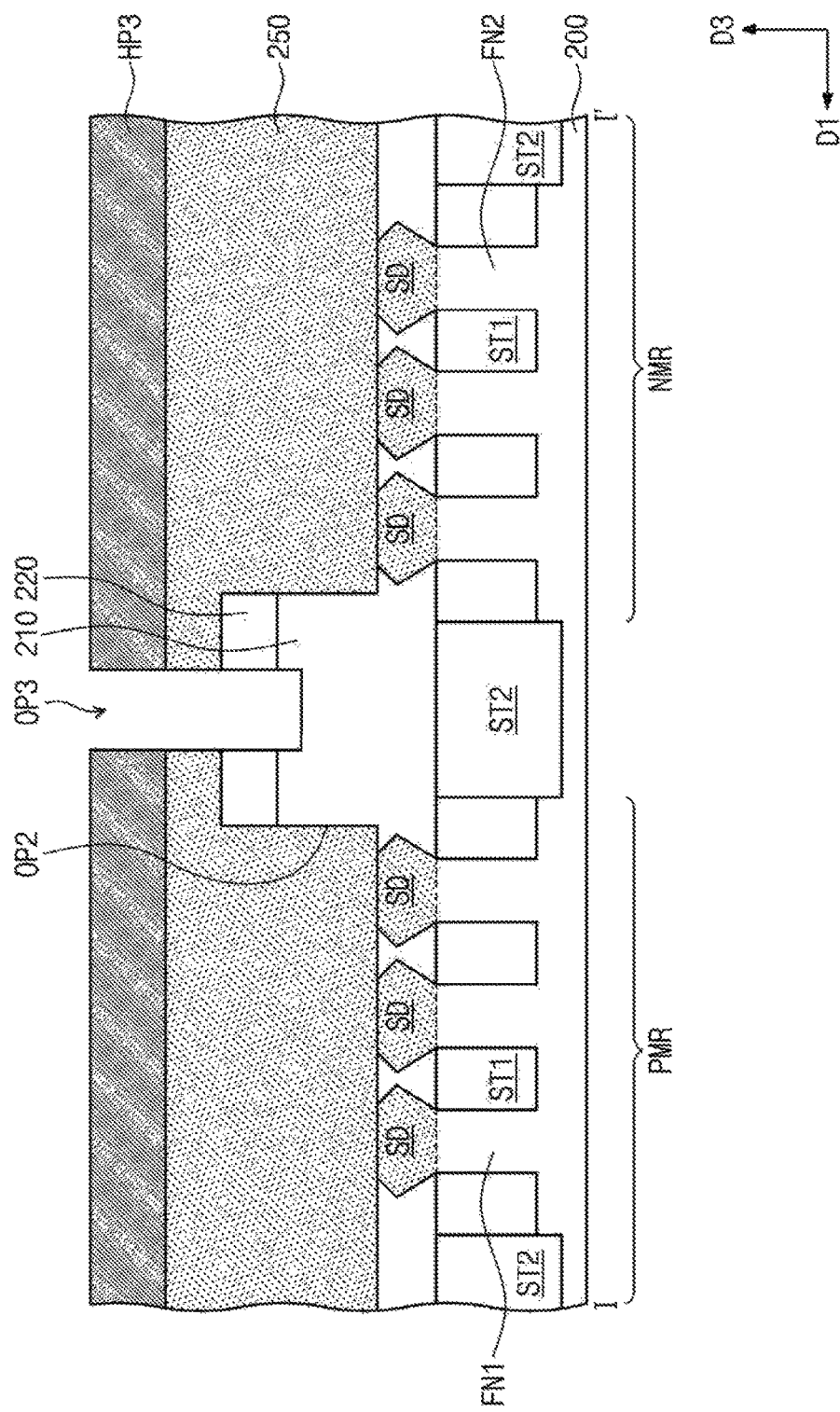
Figure 14C:
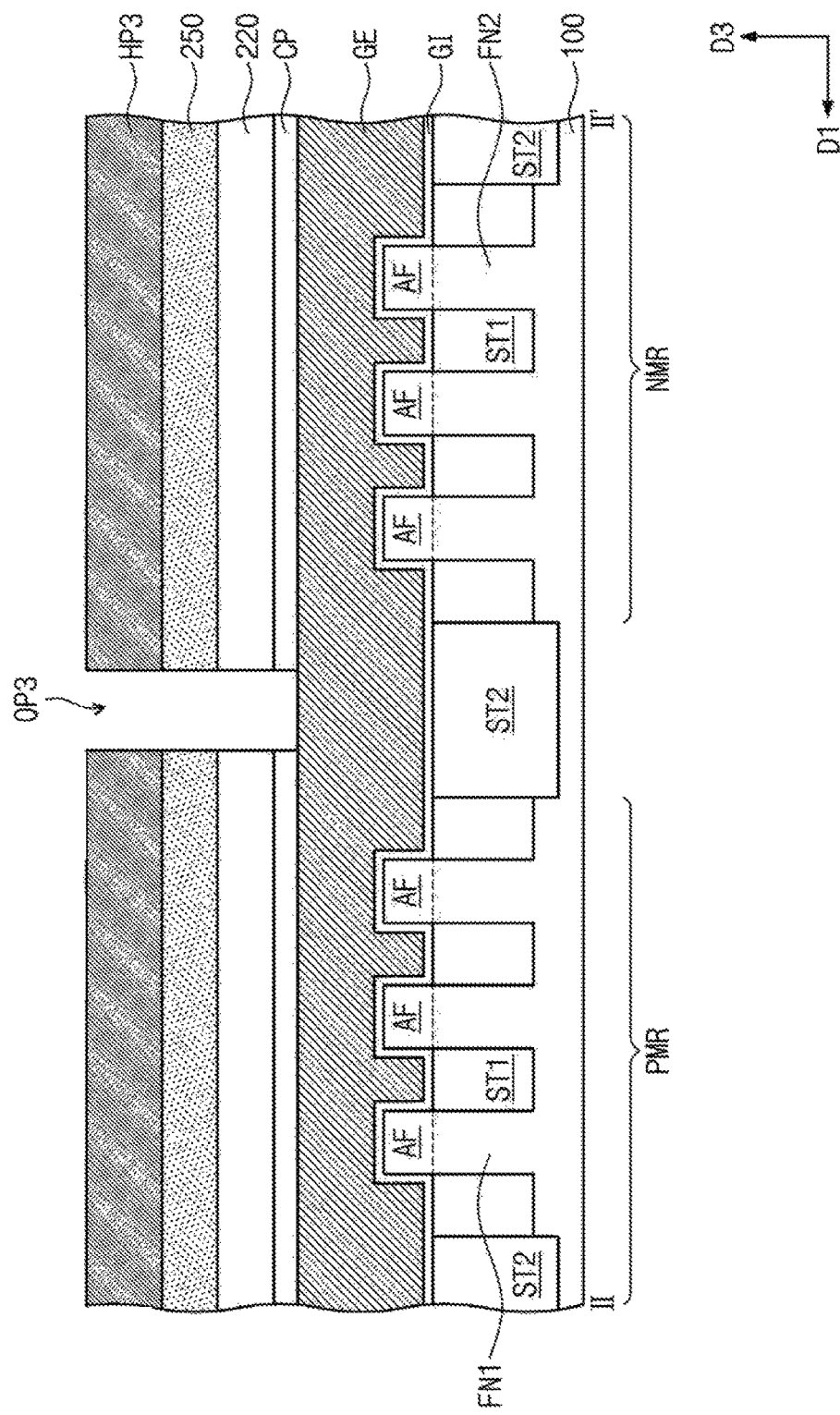
Figure 14D:
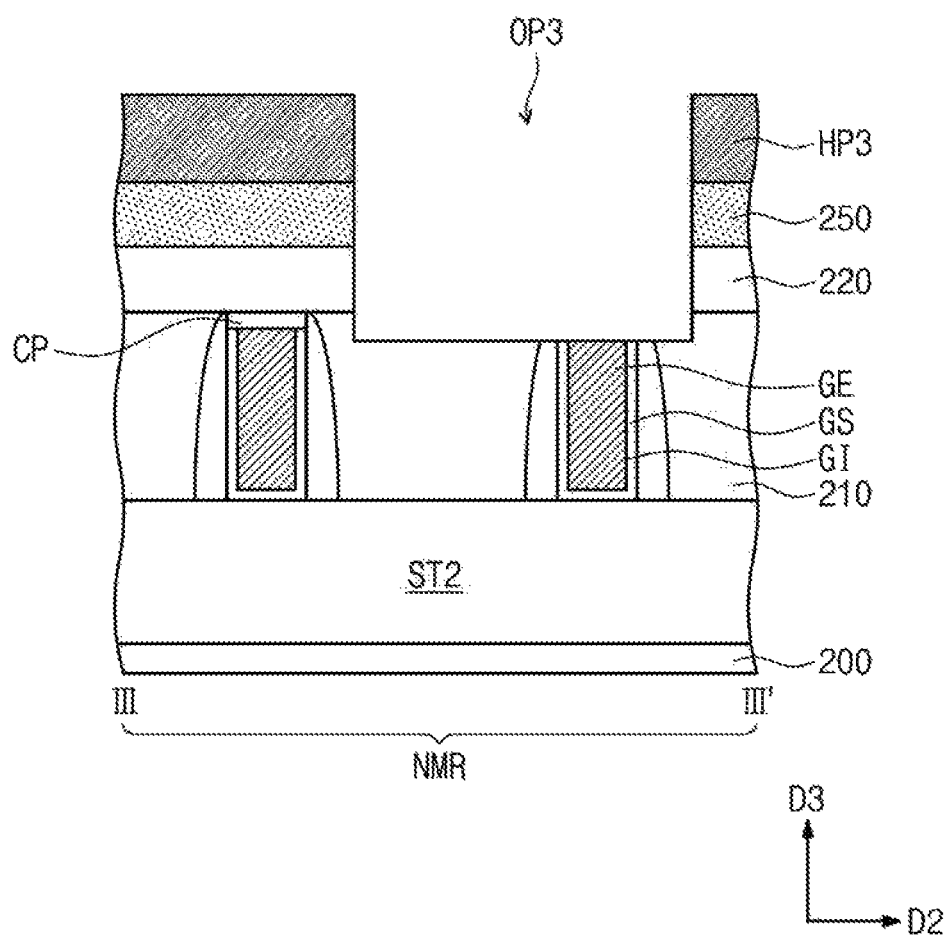
Figure 15A:
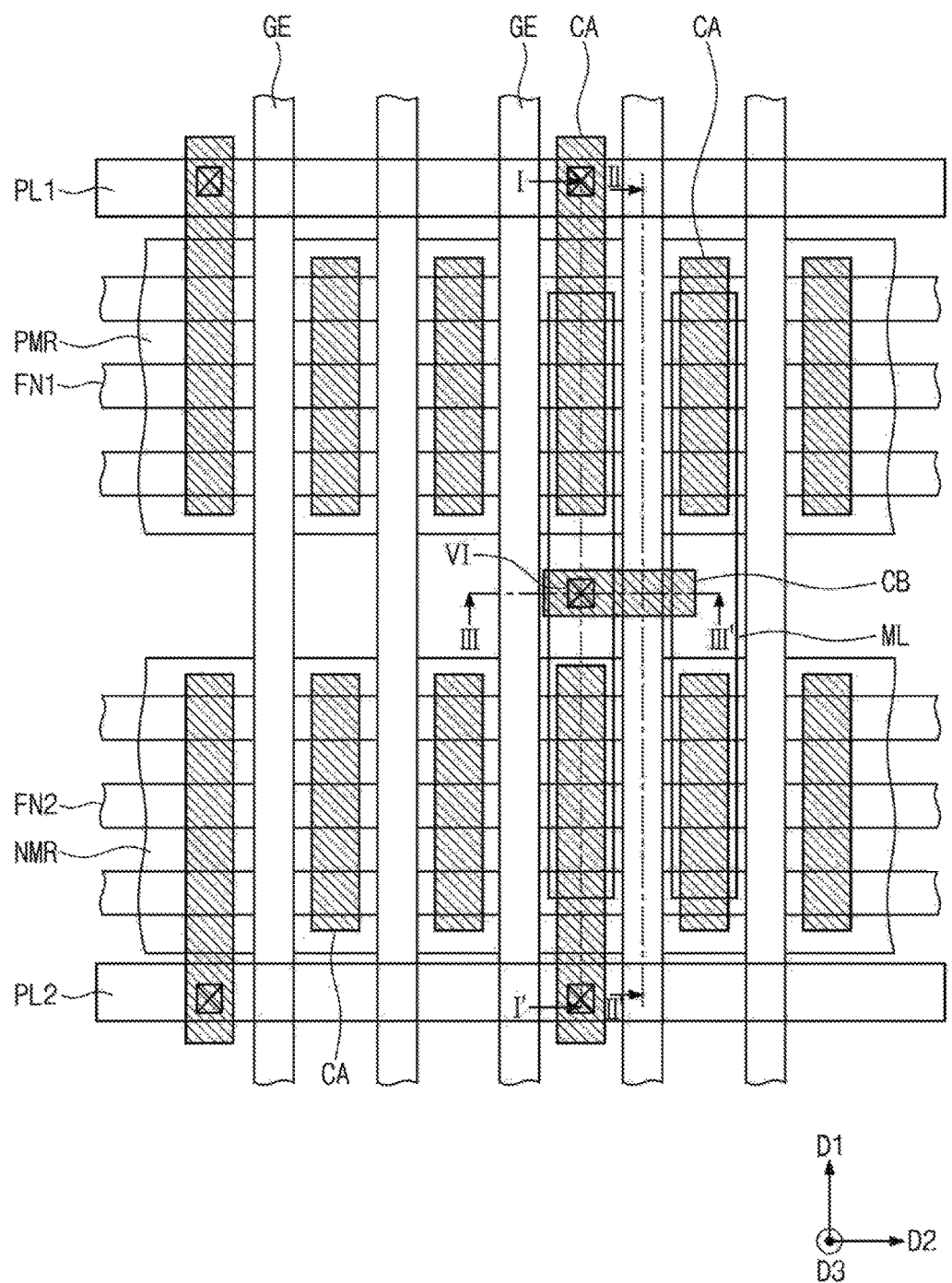
Figure 15B:
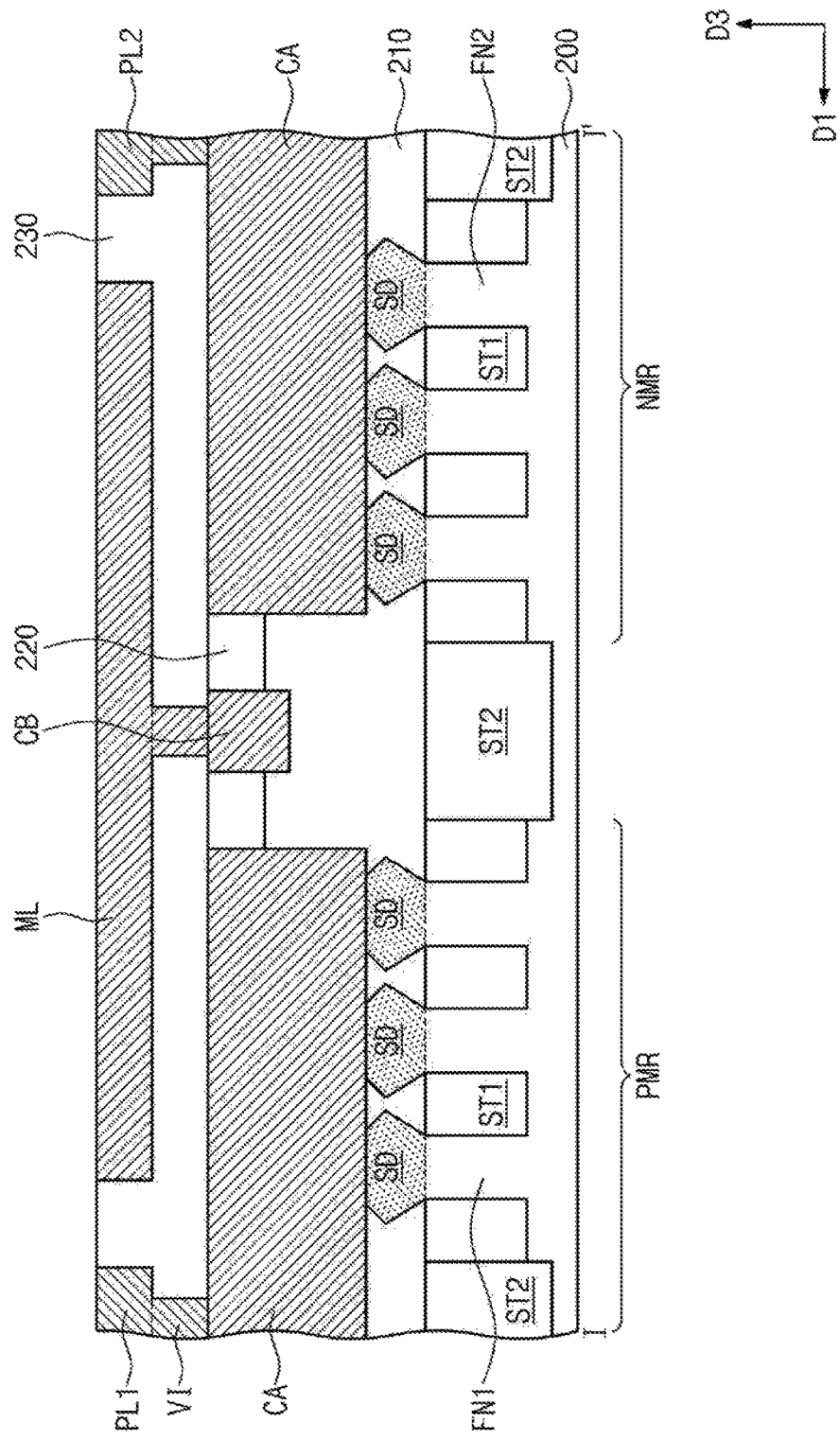
Figure 15C:
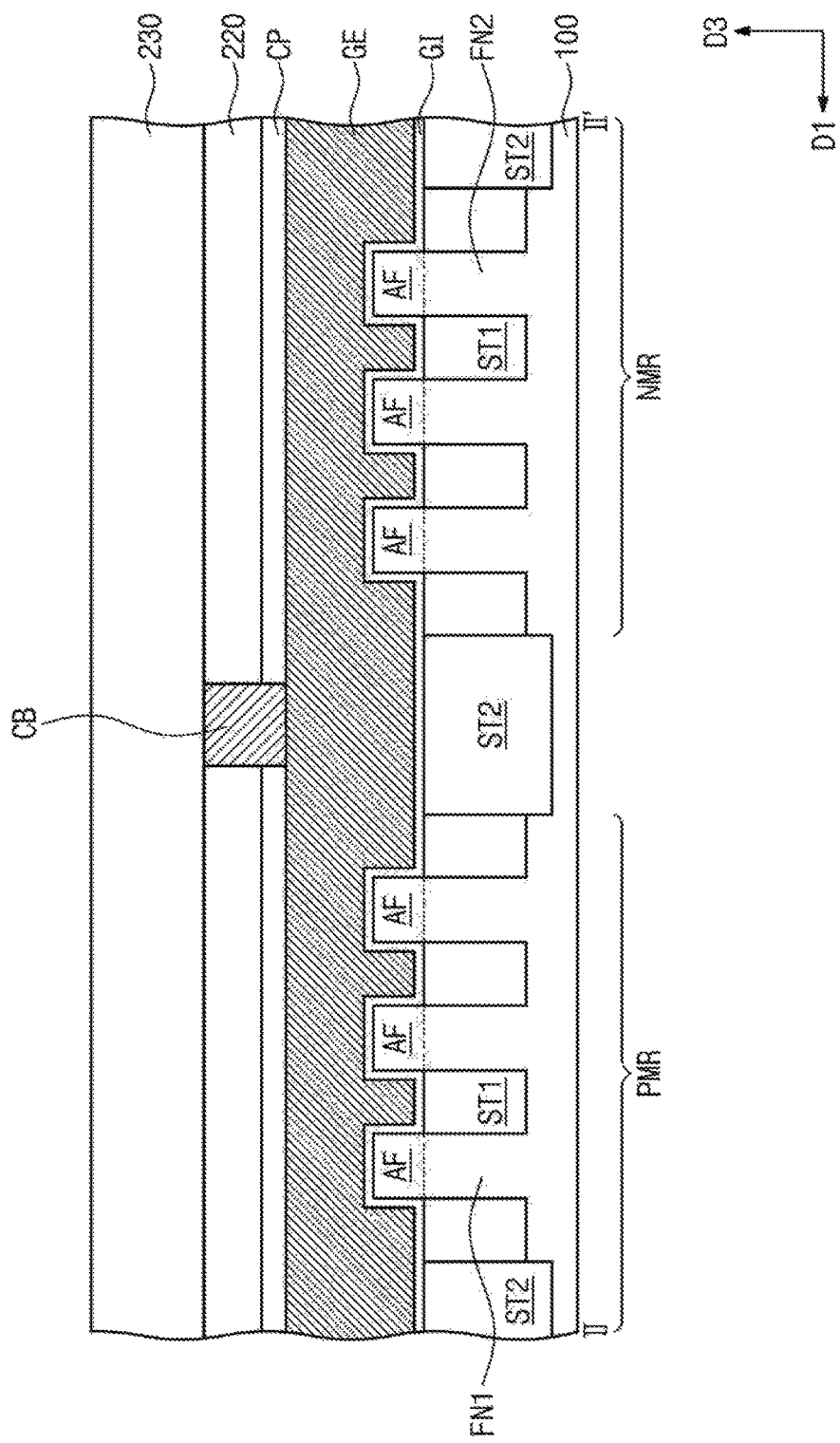
Figure 15D:
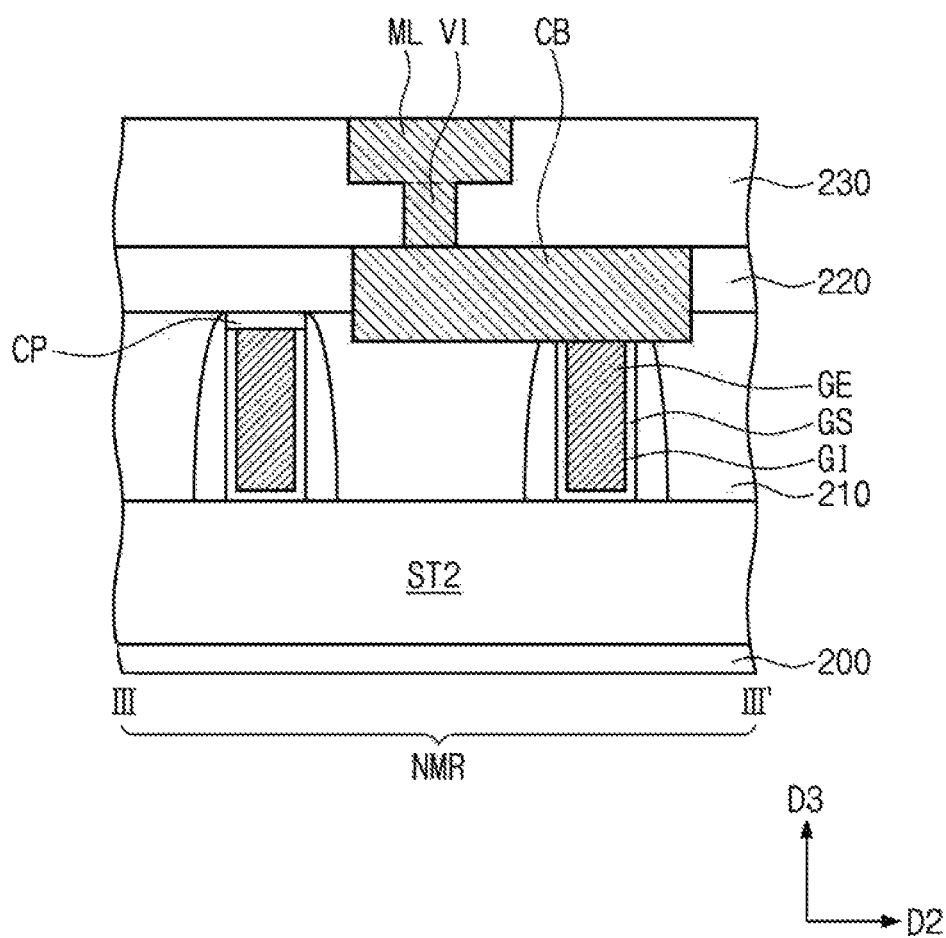

FIGS. 8A, 9A and 10A are plan views illustrating a method for fabricating a semiconductor device according to example embodiments of the inventive concepts. FIGS. 8B, 9B and 10B are cross-sectional views taken along lines I-I' and II-II' of FIGS. 8A, 9A and 10A, respectively.

Referring to FIGS. 8A and 8B, a substrate 100 may include a first region CR and a second region PE. The first region CR may be a cell region of a memory device, and the second region PE may be a peripheral circuit region of the memory device. The second region PE may also be a core region of the memory device. It will be hereinafter discussed focusing on the first region CR of the substrate 100.

A device isolation layer 102 may be formed to define first active patterns ACT1 on the first region CR of the substrate 100. The substrate 100 may be a silicon substrate, a germanium substrate, or a silicon-germanium substrate. An STI (Shallow Trench Isolation) process may be used to form the device isolation layer 102. The device isolation layer 102 may include a silicon nitride layer, a silicon oxide layer, and/or a silicon oxynitride layer. Each, or at least one, of the first active patterns ACT1 may have a planar bar shape and may be formed to have a long axis in a third direction D3. First, second, and third directions D1, D2 and D3 may be parallel to a top surface of the substrate 100. The first to third directions D1 to D3 may cross each other.

The substrate 100 may be provided therein with gate lines GL that are formed to run across the first active patterns ACT1. The gate lines GL may extend in the second direction D2 and be formed spaced apart from each other in the first direction D1. Gate dielectric patterns 104 may be formed between the gate lines GL and the first active patterns ACT1 and between the gate lines GL and the device isolation layer 102. First capping patterns 108 may be formed on the gate lines GL.

An ion implantation process may be performed on each, or at least one, of the first active patterns ACT1 so as to form a first impurity region SD1 and second impurity regions SD2 spaced apart from each other across the first impurity region SD1. In detail, the first impurity region SD1 may be formed between a pair of neighboring gate lines GL. A pair of second impurity regions SD2 may be formed on opposite sides of the pair of gate lines GL. The first and second impurity regions SD1 and SD2 may be doped with the same n-type impurities. A depth toward a bottom surface of the substrate 100 may be larger for the first impurity region SD1 than for the second impurity regions SD2.

The substrate 100 may be provided thereon with bit lines BL that are formed to run across the first active patterns ACT1. The bit lines BL may extend in the first direction D1 and be formed spaced apart from each other in the second direction D2. Each, or at least one, of the bit lines BL may be electrically connected to the first impurity region SD1. Second capping patterns 132 may be formed on the bit lines BL. A spacer layer may be conformally deposited on an entire surface of the substrate 100 and may then be anisotropically etched, and thereby bit line spacers 134 may be formed to cover opposite sidewalls of each, or at least one, of the bit lines BL.

A first interlayer dielectric layer 110 and a second interlayer dielectric layer 120 may be formed on the substrate 100. Buried contact holes may be formed to penetrate the second and first interlayer dielectric layers 120 and 110 in such a way that the second impurity regions SD2 are exposed through the buried contact holes. First buried contacts 124 may be formed by filling the buried contact holes with a conductive material. An etching target layer ET may be formed on the second interlayer dielectric layer 120 and the first buried contacts 124. The etching target layer ET may include a conductive material having at least one of, for example, a semiconductor material, a conductive metal nitride, a metal, and a metal-semiconductor compound.

In succession, it will be hereinafter discussed focusing on the second region PE of the substrate 100. At least one second active pattern ACT2 may be formed on the second region PE of the substrate 100. The second active pattern ACT2 may be formed contemporaneously or simultaneously with the first active patterns ACT1.

A gate electrode GE may be formed to run across the second active pattern ACT2. A gate dielectric layer 131 may be formed below the gate electrode GE, and a third capping pattern 133 may be formed on the gate electrode GE. Gate electrode spacers 135 may be formed to cover opposite sidewalls of the gate electrode GE. For example, the gate electrode GE may be formed contemporaneously or simultaneously with the bit lines BL, the third capping pattern 133 may be formed contemporaneously or simultaneously with the second capping pattern 132, and the gate electrode spacers 135 may be formed contemporaneously or simultaneously with the bit line spacers 134.

Third impurity regions SD3 may be formed by performing an ion implantation process on the second active pattern ACT2. The third impurity regions SD3 may be formed on opposite sides of the gate electrode GE. The third impurity regions SD3 may serve as source/drain regions of a transistor consisting of the second active pattern ACT2 and the gate electrode GE.

The first and second interlayer dielectric layers 110 and 120 may cover the second active pattern ACT2 and the gate electrode GE. Second buried contacts 125 may be formed to penetrate the first and second interlayer dielectric layers 110 and 120 in such a way that the third impurity regions SD3 may be in contact with the second buried contacts 125. For example, the second buried contacts 125 may be formed contemporaneously or simultaneously with the first buried contacts 124. The etching target layer ET may extend onto the second region PE so as to cover, on the second region PE, the second interlayer dielectric layer 120 and the second buried contacts 125.

Referring to FIGS. 9A and 9B, the substrate 100 may be provided on its first and second regions CR and PE with a first mask layer HM1, a second mask layer HM2, and an under layer UD that are stacked, for example sequentially stacked. First photoresist patterns PR1 may be formed on the under layer UD of the first region CR, and second photoresist patterns PR2 may be formed on the under layer UD of the second region PE. The formation of the first mask layer HM1, the second mask layer HM2, the under layer UD, and the first and second photoresist patterns PR1 and PR2 may be the same as discussed above with reference to FIGS. 1 and 2. For example, the first photoresist patterns PR1 may have an island shape and the second photoresist patterns PR2 may have a line shape.

Referring to FIGS. 10A and 10B, the etching target layer ET may be patterned such that landing pads LP and the conductive lines CI may be formed on the first region CR and the second region PE, respectively. The patterning of the etching target layer ET may include performing the first, second, and third etching processes EP1, EP2 and EP3 discussed above with reference to FIGS. 3 to 6. In other words, the patterning of the etching target layer ET may be the same as the patterning discussed above with reference to FIGS. 3 to 6.

A portion of each, or at least one, of the landing pads LP may vertically overlap the first buried contact 124 and the second impurity region SD2. Therefore, the landing pads LP may be electrically connected to second impurity regions SD2 through the first buried contacts 124. A portion of each, or at least one, of the conductive lines CI may vertically overlap the second buried contact 125 and the third impurity region SD3. Therefore, the conductive lines CI may be electrically connected to third impurity regions SD3 through the second buried contacts 125.

A third interlayer dielectric layer 130 may be formed to fill a space between the landing pads LP and a space between the conductive lines CI. Data storage elements DS may be formed on the landing pads LP. The data storage elements DS may be a memory element that can store data. Field effect transistors including the first active patterns ACT1 and the gate lines GL may be used as a switching element. For example, each, or at least one, of the data storage elements DS may be a memory element using one of a capacitor, a magnetic tunnel junction (MTJ) pattern, and a phase change material.

FIGS. 11A, 12A, 13A, 14A and 15A are plan views describing a method for fabricating a semiconductor device according to example embodiments of the inventive concepts. FIGS. 11B, 12B, 13B, 14B and 15B are cross-sectional views taken along line I-I' of FIGS. 11A, 12A, 13A, 14A and 15A, respectively. FIGS. 11C, 12C, 13C, 14C and 15C are cross-sectional views taken along line II-II' of FIGS. 11A, 12A, 13A, 14A and 15A, respectively. FIGS. 11D, 12D, 13D, 14D and 15D are cross-sectional views taken along line III-III' of FIGS. 11A, 12A, 13A, 14A and 15A, respectively.

Referring to FIGS. 11A to 11D, a substrate 200 may be provided. For example, the substrate 200 may be a silicon substrate, a germanium substrate, or an SOI (Silicon On Insulator) substrate. The substrate 200 may include a portion corresponding to a logic cell region where logic transistors are disposed to constitute a logic circuit of a semiconductor device. For example, the substrate 200 may be provided on its logic cell region with logic transistors constituting a core or an I/O terminal. However, the inventive concepts are not limited thereto.

Active patterns FN1 and FN2 may be formed in an upper portion of the substrate 200. First device isolation patterns ST1 may be formed to fill between the active patterns FN1 and FN2. The first device isolation patterns ST1 may be recessed to expose upper portions of the active patterns FN1 and FN2. The substrate 200 may be provided thereon with second device isolation patterns ST2 defining a PMOSFET region PMR and an NMOSFET region NMR. For example, when the second device isolation patterns ST2 are formed, the active patterns FN1 and FN2 may be removed from on other regions except the PMOSFET and NMOSFET regions PMR and NMR. Active patterns on the PMOSFET region PMR may be first active patterns FN1, and active patterns on the NMOSFET region NMR may be second active patterns FN2.

An STI (Shallow Trench Isolation) process may be employed to form the first and second device isolation patterns ST1 and ST2. The first and second device isolation patterns ST1 and ST2 may be formed using silicon oxide. For example, the first device isolation patterns ST1 may be formed shallower than the second device isolation patterns ST2. In this case, the first device isolation patterns ST1 may be formed separately from the second device isolation patterns ST2. Alternatively, the first device isolation patterns ST1 may be formed to have a depth that is substantially the same as the depth of the second device isolation patterns ST2. In this case, the first device isolation patterns ST1 may be formed contemporaneously or simultaneously with the second device isolation patterns ST2.

Gate electrodes GE may be formed to extend in a first direction D1 while crossing the first and second active patterns FN1 and FN2. The gate electrodes GE may be spaced apart from each other in a second direction D2. A gate dielectric pattern GI may be formed below each, or at least one, of the gate electrodes GE, and gate spacers GS may be formed on opposite sides of each, or at least one, of the gate electrodes GE. In addition, a capping pattern CP may be formed to cover a top surface of each, or at least one, of the gate electrodes GE.

In detail, the formation of the gate electrodes GE may include forming sacrificial patterns to run across the first and second active patterns FN1 and FN2, forming the gate spacers GS on opposite sides of each, or at least one, of the sacrificial patterns, and replacing the sacrificial patterns with the gate electrodes GE.

The gate electrodes GE may include at least one of a semiconductor, a metal, and a conductive metal nitride. The gate dielectric pattern GI may include a silicon oxide layer, a silicon oxynitride layer, a high-k dielectric layer whose dielectric constant is greater than the dielectric constant of a silicon oxide layer. Each, or at least one, of the capping pattern CP and the gate spacers GS may include at least one of a silicon oxide layer, a silicon nitride layer, and a silicon oxynitride layer.

Source/drain patterns SD may be formed on upper portions of the first and second active patterns FN1 and FN2 positioned on opposite sides of each, or at least one, of the gate electrodes GE. The source/drain patterns SD on the PMOSFET region PMR may be doped with p-type impurities, and the source/drain patterns SD on the NMOSFET region NMR may be doped with n-type impurities.

In detail, the source/drain patterns SD may be an epitaxial pattern, which may be formed by a selective epitaxial growth process. A process may be performed to recess portions of the first and second active patterns FN1 and FN2 on opposite sides of each, or at least one, of the gate electrodes GE, and then the epitaxial growth process may be performed on the recessed portions of the first and second active patterns FN1 and FN2. In this case, the epitaxial growth process may be carried out using semiconductor elements different from those of the substrate 200. For example, the source/drain patterns SD may be formed of or include semiconductor elements whose lattice constant is greater or less than the lattice constant of the semiconductor elements of the substrate 200. As the source/drain patterns SD are formed of or include semiconductor elements different from those of the substrate 200, a compressive or tensile stress may be provided to channel regions AF between the source/drain regions SD.

A first interlayer dielectric layer 210 and a second interlayer dielectric layer 220 may be formed, for example sequentially formed to cover the source/drain patterns SD and the gate electrodes GE. Each, or at least one, of the first and second interlayer dielectric layers 210 and 220 may be formed of or include a silicon oxide layer or a silicon oxynitride layer.

Referring to FIGS. 12A to 12D, the second interlayer dielectric layer 220 may be provided thereon with a first mask layer HM1, a second mask layer HM2, and a first under layer UD that are stacked, for example sequentially stacked on the second interlayer dielectric layer 220. After that, a first photoresist pattern PR1 may be formed on the first under layer UD. The formation of the first mask layer HM1, the second mask layer HM2, the first under layer UD, and the first photoresist pattern PR1 may be the same as discussed above with reference to FIGS. 1 and 2. The first photoresist pattern PR1 may be formed to have a plurality of first openings OP1. As viewed in plan, each, or at least one, of the first openings OP1 may overlap the source/drain patterns SD. In other words, as viewed in plan, each, or at least one, of the first openings OP1 may be formed between the gate electrodes GE.

Referring to FIGS. 13A to 13D, the first and second interlayer dielectric layers 210 and 220 may be patterned to form second openings OP2 through which the source/drain patterns SD are exposed. The first and second interlayer dielectric layers 210 and 220 may be the etching target layer ET discussed above with reference to FIGS. 1 to 6. For example, the patterning of the first and second interlayer dielectric layers 210 and 220 may include performing the first, second, and third etching processes EP1, EP2 and EP3 discussed above with reference to FIGS. 3 to 6. In other words, the patterning of the first and second interlayer dielectric layers 210 and 220 may be the same as the patterning of the etching target layer ET discussed above with reference to FIGS. 3 to 6.

Referring to FIGS. 14A to 14D, a remaining first mask pattern HP1 may be selectively removed. A mold layer 250 may be formed on the second interlayer dielectric layer 220. The mold layer 250 may be formed to completely fill the second openings OP2.

The mold layer 250 and the first and second interlayer dielectric layers 210 and 220 may be patterned to form a third opening OP3 that exposes a top surface of a portion of the gate electrode GE. The formation of the third opening OP3 may be same as the formation of the second openings OP2 discussed above. For example, the formation of the third opening OP3 may include forming on the mold layer 250 a third mask layer, a fourth mask layer, a second under layer, and a second photoresist pattern, and then performing the first to third etching processes EP1 to EP3 discussed above with reference to FIGS. 3 to 6.

Referring to FIGS. 15A to 15D, a remaining third mask pattern HP3 may be selectively removed. After that, the second openings OP2 and the third opening OP3 may be filled with a conductive material such that first conductive patterns CA and a second conductive pattern CB may be formed, respectively.

A third interlayer dielectric layer 230 may be provided on the second interlayer dielectric layer 220. The third interlayer dielectric layer 230 may be formed of or include a silicon oxide layer or a silicon oxynitride layer. First and second power lines PL1 and PL2 and conductive lines ML may be formed in the third interlayer dielectric layer 230. Each, or at least one, of the first and second power lines PL1 and PL2 and the conductive lines ML may include a via VI in contact with the conductive pattern CA or CB that is disposed below a corresponding one of the first and second power lines PL1 and PL2 and the conductive lines ML. The formation of the first and second power lines PL1 and PL2 and the conductive lines ML may be similar to or the same as the formation of the first and second conductive patterns CA and CB discussed above.

A method for fabricating a semiconductor device according to the example embodiments of the inventive concepts may use a mask layer having a high etch selectivity with respect to a photoresist pattern formed by EUV photolithography. Therefore, an etching target layer may be patterned to form a desired fine pattern.

This detailed description of the inventive concepts should not be construed as limited to the example embodiments set forth herein, and it is intended that the inventive concepts cover the various combinations, the modifications and variations of this invention without departing from the spirit and scope thereof. The appended claims should be construed to include other example embodiments.

What is claimed is:

1. A method for fabricating a semiconductor device, the method comprising:
    forming a gate line to run across an active pattern of a first region of a substrate;

forming a first impurity region and a second impurity region in the active pattern on opposite sides of the gate line;

stacking an interlayer dielectric layer, a conductive layer, and a first mask layer on the substrate;

forming a second mask layer between the conductive layer and the first mask layer;

forming a photoresist pattern on the first mask layer;

patterning the first mask layer to form a first mask pattern using the photoresist pattern as an etching mask;

patterning the second mask layer to form a second mask pattern using the first mask pattern as an etching mask; and patterning the conductive layer using the second mask pattern as an etching mask to form a first conductive pattern electrically connected to the first impurity region, wherein the first mask layer includes at least one of a silicon layer and a titanium oxide layer.

2. The method of claim 1, wherein the forming the photoresist pattern comprises:

forming a photoresist layer on the first mask layer; and performing on the photoresist layer an exposure and development process using extreme ultraviolet (EUV) radiation.

3. The method of claim 1, wherein the second mask layer comprises an SOH (Spin On Hardmask) layer, an SOC (Spin On Carbon) layer, or an amorphous carbon layer.

4. The method of claim 1, wherein the patterning the first mask layer comprises performing a dry etching process, the dry etching process using an etching gas including at least one of $SF_6$, HBr, and $BCl_3$.

5. The method of claim 1, further comprising:

forming a second conductive pattern on a second region of the substrate; and forming a data storage element on the first conductive pattern, wherein the second conductive pattern is formed contemporaneously with the first conductive pattern, and the second conductive pattern is formed to have a line shape extending in a single direction.

6. The method of claim 1, wherein the forming the gate line comprises forming a pair of gate lines to run across the active pattern, the second impurity region being formed between the pair of gate lines, and the method further includes forming a bit line electrically connected to the second impurity region.

* * * * *